(12) United States Patent
Kwak et al.

(10) Patent No.: US 11,955,531 B2
(45) Date of Patent: Apr. 9, 2024

(54) METHOD OF FORMING AN INTEGRATED CIRCUIT DEVICE HAVING A CONTACT CAPPING LAYER

(71) Applicant: SAMSUNG ELECTRONICS CO., LTD., Suwon-si (KR)

(72) Inventors: Dae-young Kwak, Seongnam-si (KR); Ji-ye Kim, Suwon-si (KR); Jung-hwan Chun, Hwaseong-si (KR); Min-chan Gwak, Hwaseong-si (KR); Dong-hyun Roh, Suwon-si (KR); Jin-wook Lee, Seoul (KR); Sang-jin Hyun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/174,902

(22) Filed: Feb. 27, 2023

(65) Prior Publication Data
US 2023/0207662 A1 Jun. 29, 2023

Related U.S. Application Data

(63) Continuation of application No. 17/393,217, filed on Aug. 3, 2021, now Pat. No. 11,626,503, which is a
(Continued)

(30) Foreign Application Priority Data

Nov. 23, 2018 (KR) .................. 10-2018-0146777

(51) Int. Cl.
*H01L 21/8238* (2006.01)
*H01L 27/092* (2006.01)
(Continued)

(52) U.S. Cl.
CPC .............. *H01L 29/66515* (2013.01); *H01L 21/823821* (2013.01); *H01L 21/823871* (2013.01);
(Continued)

(58) Field of Classification Search
CPC .......... H01L 21/76897; H01L 27/0924; H01L 29/45; H01L 29/7851; H10B 10/12; H10B 12/48
(Continued)

(56) References Cited

U.S. PATENT DOCUMENTS

| 7,429,765 B2 | 9/2008 | Goda et al. |
| 8,501,623 B2 | 8/2013 | Oh et al. |

(Continued)

FOREIGN PATENT DOCUMENTS

| CN | 106098775 A | 11/2016 |
| CN | 106898597 A | 6/2017 |

(Continued)

*Primary Examiner* — Hoai V Pham
(74) *Attorney, Agent, or Firm* — Myers Bigel, P.A.

(57) ABSTRACT

An integrated circuit device includes a fin-type active region protruding from a top surface of a substrate and extending in a first direction parallel to the top surface of the substrate, a gate structure intersecting with the fin-type active region and extending on the substrate in a second direction perpendicular to the first direction, a source/drain region on a first side of the gate structure, a first contact structure on the source/drain region, and a contact capping layer on the first contact structure. A top surface of the first contact structure has a first width in the first direction, a bottom surface of the contact capping layer has a second width greater than the first width stated above in the first direction, and the contact capping layer includes a protruding portion extending outward from a sidewall of the first contact structure.

20 Claims, 32 Drawing Sheets

Related U.S. Application Data continuation of application No. 16/552,150, filed on Aug. 27, 2019, now Pat. No. 11,114,544.

(51) Int. Cl.
  *H01L 29/45* (2006.01)
  *H01L 29/66* (2006.01)
  *H01L 29/78* (2006.01)
  *H10B 10/00* (2023.01)

(52) U.S. Cl.
  CPC .......... *H01L 27/0924* (2013.01); *H01L 29/45* (2013.01); *H01L 29/66795* (2013.01); *H01L 29/7851* (2013.01); *H10B 10/12* (2023.02)

(58) Field of Classification Search
  USPC ........................................................ 438/618
  See application file for complete search history.

(56) References Cited

U.S. PATENT DOCUMENTS

| | | | |
|---|---|---|---|
| 9,111,907 B2 * | 8/2015 | Kamineni | ......... H01L 29/41791 |
| 9,502,286 B2 | 11/2016 | Xie et al. | |
| 9,984,886 B2 | 5/2018 | Kim et al. | |
| 10,043,800 B2 | 8/2018 | Kim et al. | |
| 10,164,029 B2 | 12/2018 | Chang et al. | |
| 10,177,093 B2 | 1/2019 | Kim et al. | |
| 10,249,605 B2 | 4/2019 | Subhash et al. | |
| 10,262,937 B2 | 4/2019 | Lee et al. | |
| 10,396,034 B2 | 8/2019 | Siew et al. | |
| 10,665,588 B2 | 5/2020 | Jun et al. | |
| 11,217,585 B2 | 1/2022 | Lin et al. | |
| 2016/0005822 A1 | 1/2016 | Song et al. | |
| 2017/0179241 A1 | 6/2017 | Chang et al. | |
| 2018/0114846 A1 | 4/2018 | Alptekin et al. | |
| 2018/0151431 A1 | 5/2018 | Wang | |
| 2018/0211874 A1 | 7/2018 | Basker et al. | |
| 2019/0006231 A1 | 1/2019 | Tsai et al. | |

FOREIGN PATENT DOCUMENTS

| | | |
|---|---|---|
| CN | 107871739 A | 4/2018 |
| CN | 107919357 A | 4/2018 |
| CN | 107919358 A | 4/2018 |
| CN | 108172571 A | 6/2018 |
| CN | 108573969 A | 9/2018 |
| CN | 108573999 A | 9/2018 |
| KR | 20060038242 A | 5/2006 |
| KR | 20110009545 A | 1/2011 |
| KR | 101063935 B1 | 9/2011 |
| KR | 20180037662 A | 4/2018 |
| KR | 20180037765 A | 4/2018 |
| KR | 20180103397 A | 9/2018 |

* cited by examiner

Y1 - Y1'

X1 - X1'

Y1 - Y1'

X2 - X2'

X1 - X1'

Y1 - Y1'

X1 - X1'

X1 - X1'

X1 - X1'

X1 - X1'

METHOD OF FORMING AN INTEGRATED CIRCUIT DEVICE HAVING A CONTACT CAPPING LAYER

CROSS-REFERENCE TO RELATED APPLICATIONS

This U.S. non-provisional patent application is a continuation of U.S. patent application Ser. No. 17/393,217, filed Aug. 3, 2021, which application is a continuation of U.S. patent application Ser. No. 16/552,150, filed Aug. 27, 2019, issued as U.S. Pat. No. 11,114,544 on Sep. 7, 2021, which itself claims priority under 35 U.S.C. § 119 to Korean Patent Application No. 10-2018-0146777, filed on Nov. 23, 2018, in the Korean Intellectual Property Office, the disclosures of each are incorporated herein in their entireties by reference.

BACKGROUND

The inventive concept relates to an integrated circuit device, and more particularly, to an integrated circuit device including a fin-type active region.

With the trend of producing lighter, thinner, and smaller electronics, there is increasing demand for higher integration of integrated circuit devices. As integrated circuit devices have been down-scaled, there have been issues with the deterioration in reliability of integrated circuit devices due to short channel effects of transistors. To reduce short channel effects, integrated circuit devices including fin-type active regions have been proposed. However, as the design rules decrease, the sizes of fin-type active regions, gate lines, and/or source/drain regions decrease, such that processes of forming electrical connection structures for the gate lines and source/drain regions have become difficult.

SUMMARY

The inventive concept provides an integrated circuit device for reducing or preventing faults in a fabrication process of a contact structure having a reduced size.

According to some embodiments of the inventive concepts, there is provided an integrated circuit device including a fin-type active region protruding from a top surface of a substrate and extending in a first direction that is parallel to the top surface of the substrate, a gate structure intersecting the fin-type active region and extending on the substrate in a second direction that is perpendicular to the first direction, a source/drain region on a first side of the gate structure, a first contact structure on the source/drain region, and a contact capping layer on the first contact structure. A top surface of the first contact structure has a first width in the first direction, a bottom surface of the contact capping layer has a second width that is greater than the first width of the top surface of the first contact structure in the first direction, and the contact capping layer includes a protruding portion extending outward from a sidewall of the first contact structure.

According to some embodiments of the inventive concepts, there is provided an integrated circuit device including first to fourth fin-type active regions protruding from a top surface of a substrate and extending in a first direction that is parallel to the top surface of the substrate, first to fourth gate structures extending on the substrate in a second direction that is perpendicular to the first direction, the first gate structure intersecting with the third and fourth fin-type active regions, the second gate structure intersecting with the first fin-type active region, the third gate structure intersecting with the fourth fin-type active region, the fourth gate structure intersecting with the first and second fin-type active regions, a first source/drain region on a first side of the first gate structure, a first contact structure on the first source/drain region, and a contact capping layer on the first contact structure. The contact capping layer includes a protruding portion extending outward from a sidewall of the first contact structure.

According to some embodiments of the inventive concepts, there is provided an integrated circuit device including a fin-type active region protruding from a top surface of a substrate and extending in a first direction that is parallel to the top surface of the substrate, a gate structure intersecting the fin-type active region and extending on the substrate in a second direction that is perpendicular to the first direction, a source/drain region on a first side of the gate structure, an interlayer dielectric on the gate structure and the source/drain region, a first contact structure arranged in a lower portion of a contact hole and connected to the source/drain region, the contact hole penetrating the interlayer dielectric, and a contact capping layer in an upper portion of the contact hole and on the first contact structure. The contact capping layer includes a protruding portion extending outward from a sidewall of the first contact structure, and the protruding portion is surrounded by the interlayer dielectric.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Hereinafter, example embodiments of the inventive concept will be described in detail with reference to the accompanying drawings. It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

Figure 1:
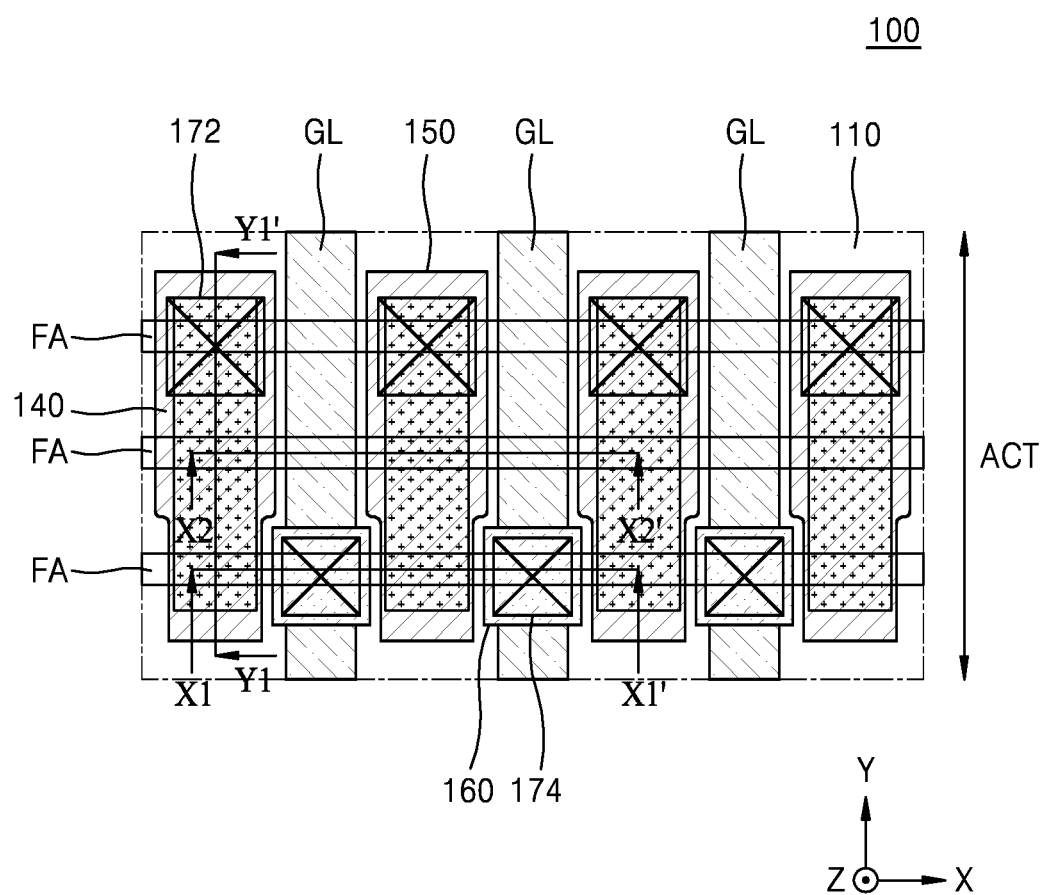
FIG. 1 is a layout diagram illustrating an integrated circuit device according to example embodiments.
Figure 2A:
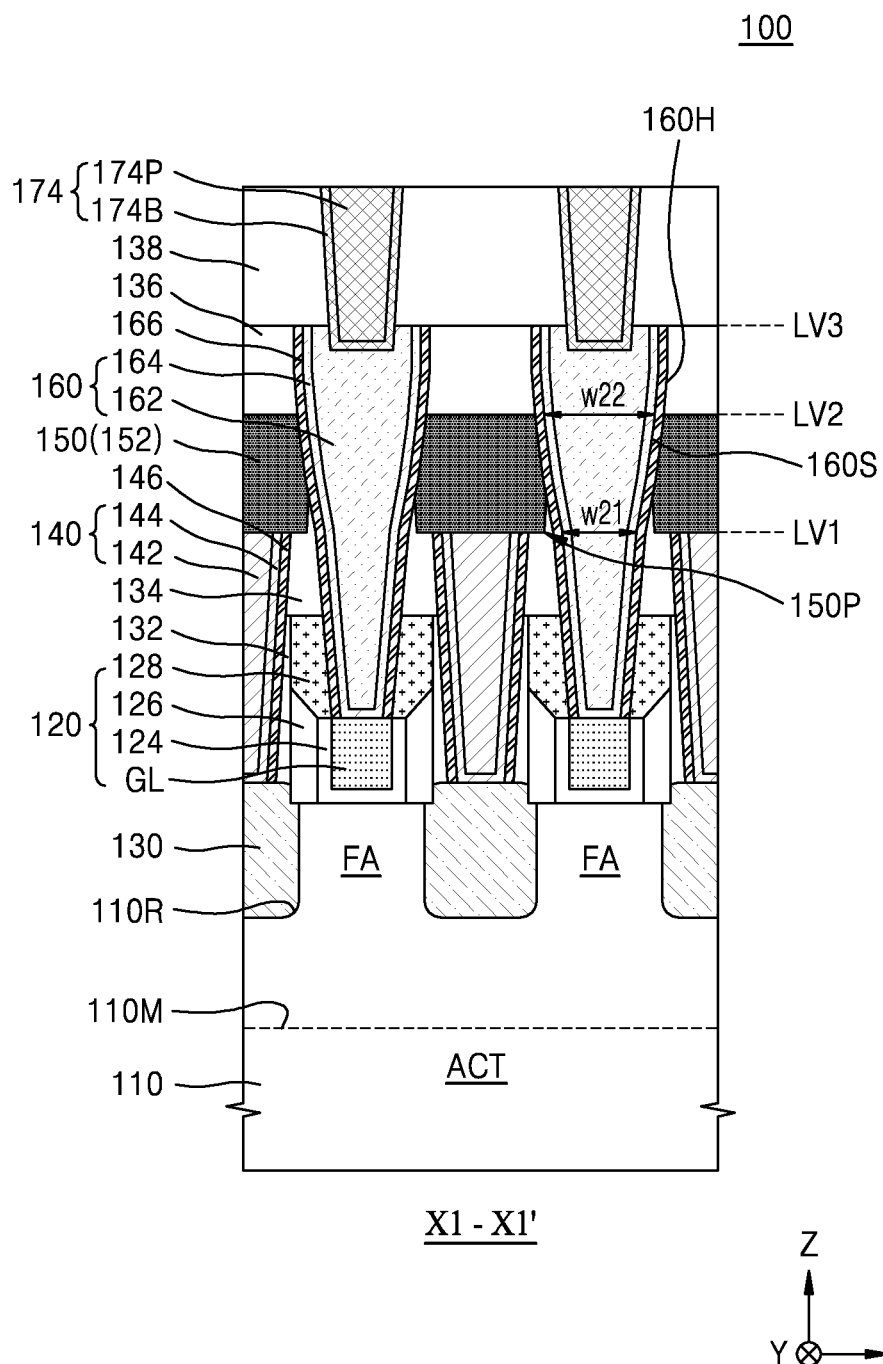
FIG. 2A is a cross-sectional view taken along a line X1-X1' of FIG. 1.
Figure 2B:
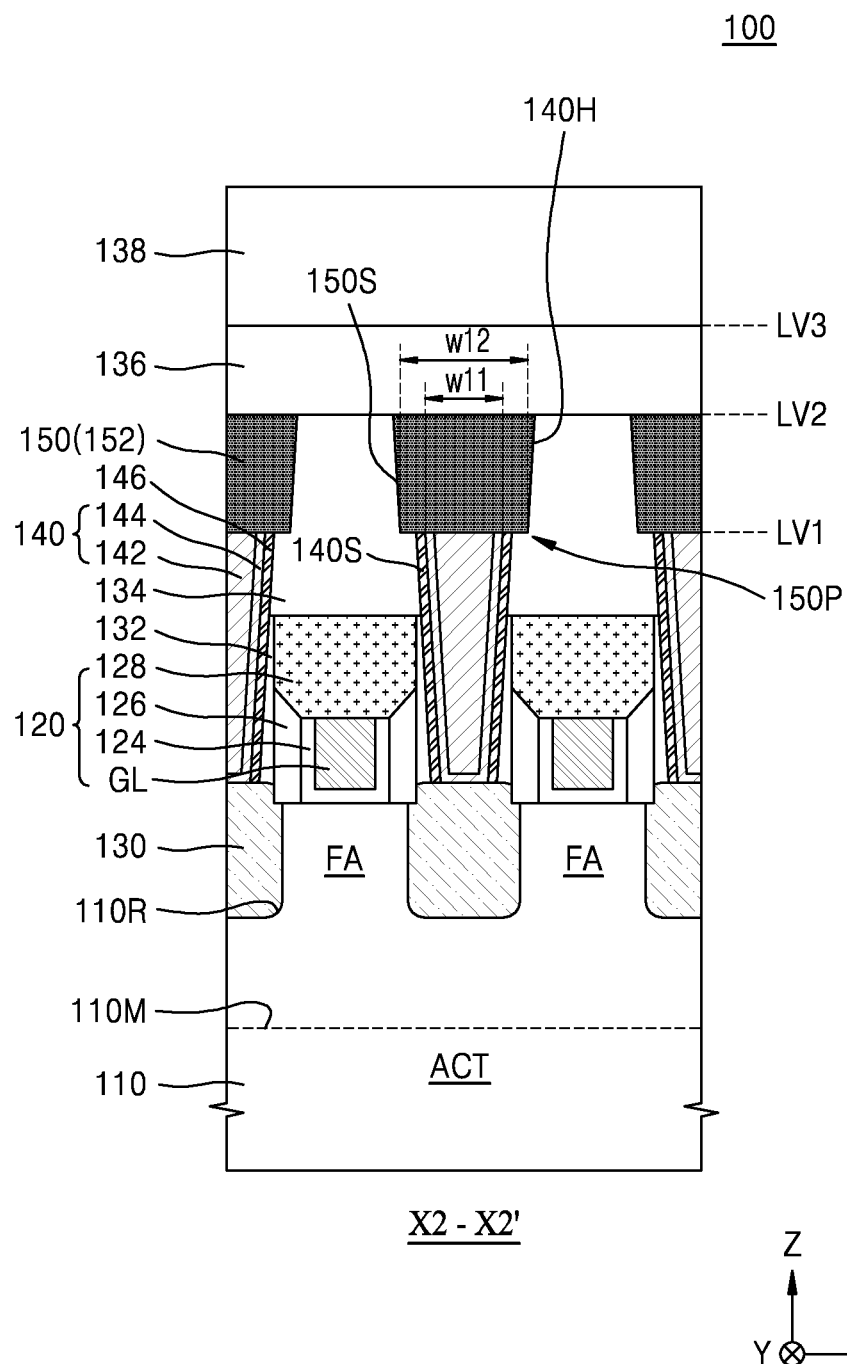
FIG. 2B is a cross-sectional view taken along a line X2-X2' of FIG. 1.
Figure 2C:
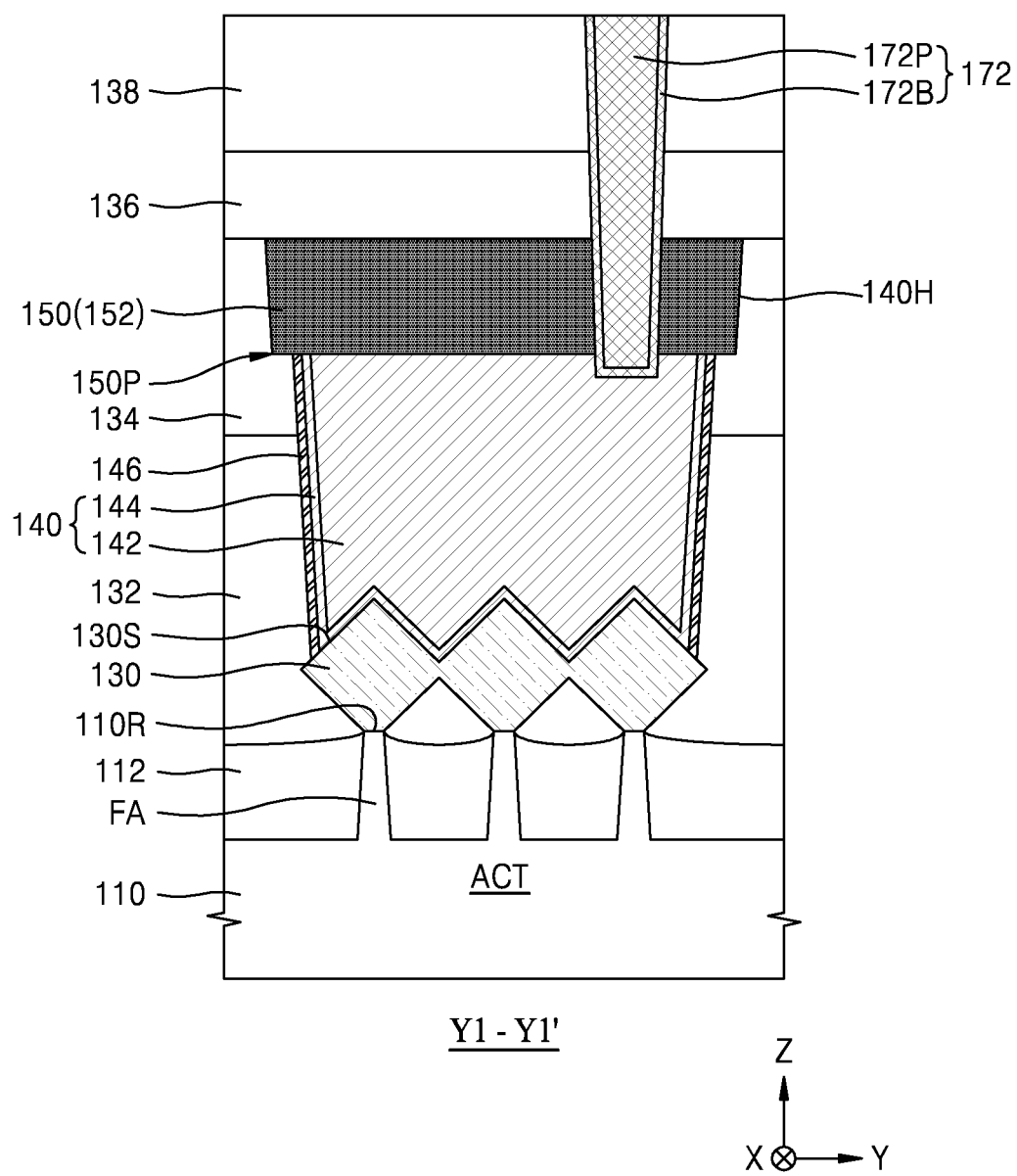
FIG. 2C is a cross-sectional view taken along a line Y1-Y1' of FIG. 1, according to example embodiments.

FIG. 1 is a layout diagram illustrating an integrated circuit device 100 according to example embodiments. FIG. 2A is a cross-sectional view taken along a line X1-X1' of FIG. 1, FIG. 2B is a cross-sectional view taken along a line X2-X2' of FIG. 1, and FIG. 2C is a cross-sectional view taken along a line Y1-Y1' of FIG. 1. Some components of the integrated circuit device 100 are omitted from FIG. 1 to provide a clearer view.

Referring to FIGS. 1 and 2A to 2C, a substrate 110 may include an active region ACT. In example embodiments, the substrate 110 may include a Group IV semiconductor such as Si or Ge, a Group IV-IV compound semiconductor such as SiGe or SiC, or a Group III-V compound semiconductor such as GaAs, InAs, or InP. The substrate 110 may include a conductive region, for example, an impurity-doped well, or an impurity-doped structure.

The active region ACT may include standard cells performing logical functions. The standard cells may include various logic cells including a plurality of circuit elements such as a transistor and a register. The logic cells may include, for example, AND, NAND, OR, NOR, exclusive OR (XOR), exclusive NOR (XNOR), an inverter (INV), an adder (ADD), a buffer (BUF), a delay (DLY), a filter (FIL), a multiplexer (MXT/MXIT), OR/AND/INVERTER (OAI), AND/OR (AO), AND/OR/INVERTER (AOI), a D flip-flop, a reset flip-flop, a master-slave flip-flop, a latch, and/or the like. The active region ACT may be a region in which a PMOS transistor is formed, or a region in which an NMOS transistor is formed.

A plurality of fin-type active regions FA may protrude from a top surface 110M of the substrate 110 in a vertical direction (Z direction) and may extend in a first horizontal direction (X direction). Both sidewalls of each of the plurality of fin-type active regions FA may be covered with an isolation layer 112. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

A gate structure 120 may extend on the substrate 110 in a second horizontal direction (Y direction) to intersect with the plurality of fin-type active regions FA. A bottom surface of the gate structure 120 may cover the isolation layer 112 and upper sidewalls of the plurality of fin-type active regions FA. The gate structure 120 may include a gate line GL, a gate insulating layer 124, a gate spacer 126, and a gate capping layer 128.

The gate line GL may include doped polysilicon, a metal, a conductive metal nitride, a conductive metal carbide, a conductive metal silicide, or a combination thereof. For example, the gate line GL may include Al, Cu, Ti, Ta, W, Mo, TaN, NiSi, CoSi, TiN, WN, TiAl, TiAlN, TaCN, TaC, TaSiN, or a combination thereof, without being limited thereto. In example embodiments, the gate line GL may include a work function control metal-containing layer and a gap-fill metal layer. The work function control metal-containing layer may include at least one metal selected from among Ti, W, Ru, Nb, Mo, Hf, Ni, Co, Pt, Yb, Tb, Dy, Er, and Pd. The gap-fill metal layer may include a W film or an Al film. In example embodiments, the gate line GL may include a stack structure of TiAlC/TiN/W, a stack structure of TiN/TaN/TiAlC/TiN/W, or a stack structure of TiN/TaN/TiN/TiAlC/TiN/W, without being limited thereto.

The gate insulating layer 124 may extend on a bottom surface and sidewalls of the gate line GL in the second horizontal direction. The gate insulating layer 124 may be arranged between the gate line GL and each fin-type active region FA and between the gate line GL and a top surface of the isolation layer 112. The gate insulating layer 124 may include a silicon oxide film, a silicon oxynitride film, a high-k dielectric film having a higher dielectric constant than a silicon oxide film, or a combination thereof. The high-k dielectric film may include a metal oxide or a metal oxynitride. For example, the high-k dielectric film, which may be used as the gate insulating layer 124, may include $HfO_2$, HfSiO, HfSiON, HfTaO, HfTiO, HfZrO, $ZrO_2$, $Al_2O_3$, or a combination thereof, without being limited thereto.

The gate spacer 126 may be arranged on both sidewalls of the gate line GL. The gate spacer 126 may extend on both sidewalls of the gate line GL in an extension direction of the gate line GL. The gate insulating layer 124 may be arranged between the gate line GL and the gate spacer 126. In example embodiments, the gate spacer 126 may include silicon oxide ($SiO_x$), silicon nitride ($SiN_x$), silicon oxynitride ($SiO_xN_y$), silicon carbonitride ($SiC_xN_y$), silicon oxycarbonitride ($SiO_xC_yN_z$), or a combination thereof.

In example embodiments, the gate spacer 126 may include a plurality of layers including different materials from each other. Although FIG. 2A illustrates an example in which the gate spacer 126 includes a single layer, unlike this example, the gate spacer 126 may include a first spacer layer (not shown), a second spacer layer (not shown), and a third spacer layer (not shown), which are sequentially stacked on a sidewall of the gate line GL. In example embodiments, each of the first spacer layer and the third spacer layer may include silicon nitride, silicon oxide, or silicon oxynitride. The second spacer layer may include an insulating material having a lower dielectric constant than the first spacer layer. In some embodiments, the second spacer layer may include an air space.

The gate capping layer 128 may be arranged on the gate line GL and the gate spacer 126. The gate capping layer 128 may cover a top surface of the gate line GL and a top surface of the gate spacer 126 and may extend in the second horizontal direction (Y direction). In example embodiments, the gate capping layer 128 may include silicon nitride or silicon oxynitride.

Although FIGS. 2A and 2B illustrate an example in which the gate capping layer 128 covers top surfaces of all of the gate line GL, the gate insulating layer 124, and the gate spacer 126, the inventive concept is not limited thereto. In other embodiments, unlike the example shown in FIGS. 2A and 2B, the gate capping layer 128 may cover top surfaces of both the gate line GL and the gate insulating layer 124 within a space defined by sidewalls of a pair of gate spacers 126.

A recess region 110R may be formed in a fin-type active region FA on both sides of the gate structure 120, and a source/drain region 130 may fill the inside of the recess region 110R. The source/drain region 130 may have a vertical cross-section of a polygonal shape having a plurality of inclined sidewalls 130S (see FIG. 2C). As shown in FIG. 2C, an inclined sidewall 130S of a source/drain region 130 connected to one of the plurality of fin-type active regions FA may be connected to an inclined sidewall 130S of a source/drain region 130 connected to another fin-type active region FA adjacent to the one fin-type active region FA, without being limited thereto.

The source/drain region 130 may include a doped SiGe film, a doped Ge film, a doped SiC film, or a doped InGaAs film, without being limited thereto. In an example process, the recess region 110R may be formed by partially removing the fin-type active region FA on both sides of the gate structure 120, and then, the source/drain region 130 may be formed on an inner wall of the recess region 110R by an epitaxy process.

In example embodiments, when the fin-type active region FA is an active region for a PMOS transistor, the source/drain region 130 may include doped SiGe, and when the fin-type active region FA is an active region for an NMOS transistor, the source/drain region 130 may include doped SiC. However, the inventive concept is not limited thereto.

In example embodiments, the source/drain region 130 may include a plurality of semiconductor layers having different compositions from each other. For example, the source/drain region 130 may include a lower semiconductor layer (not shown), an upper semiconductor layer (not shown), and a capping semiconductor layer (not shown), which sequentially fill the inside of the recess region 110R. For example, each of the lower semiconductor layer, the upper semiconductor layer, and the capping semiconductor layer may include SiGe in which an amount of each of Si and Ge is different.

Although not shown, an etch stop layer (not shown) may be further formed on a sidewall of the source/drain region 130 and the top surface of the isolation layer 112. The etch stop layer may include at least one of silicon nitride, silicon oxynitride, silicon oxycarbonitride, and silicon oxide.

An inter-gate dielectric 132 may be formed between gate structures 120 to cover the source/drain region 130 and the isolation layer 112. A first interlayer dielectric 134 may be formed on the gate structure 120 and the inter-gate dielectric 132. Each of the inter-gate dielectric 132 and the first interlayer dielectric 134 may include at least one of silicon oxynitride, silicon oxycarbonitride, and silicon oxide.

A first contact structure 140 may be arranged on the source/drain region 130. The first contact structure 140 may be arranged with a certain height in a first contact hole 140H, which penetrates the first interlayer dielectric 134 and the inter-gate dielectric 132. A level LV1 of a top surface of the first contact structure 140 may be lower than a level LV2 of a top surface of the first interlayer dielectric 134.

The first contact structure 140 may include a first contact plug 142 and a first barrier layer 144. The first barrier layer 144 may surround a sidewall and a bottom surface of the first contact plug 142. The first contact plug 142 may include at least one of cobalt (Co), tungsten (W), nickel (Ni), ruthenium (Ru), copper (Cu), aluminum (Al), a silicide thereof, and an alloy thereof. The first barrier layer 144 may include at least one of ruthenium (Ru), titanium (Ti), titanium nitride (TiN), tantalum (Ta), tantalum nitride (TaN), tungsten (W), titanium silicon nitride (TiSiN), titanium silicide (TiSi), and tungsten silicide (WSi).

A first insulating liner 146 may be further arranged on a sidewall of the first contact hole 140H to surround a sidewall of the first contact structure 140. The first contact structure 140 may not contact the inter-gate dielectric 132 and the first interlayer dielectric 134 by the first insulating liner 146. The first insulating liner 146 may include silicon nitride or silicon oxynitride. Although not shown, a metal silicide layer (not shown) may be further formed between the source/drain region 130 and a bottom surface of the first contact structure 140.

A contact capping layer 150 may be arranged on the first contact structure 140 to fill an upper portion of the first contact hole 140H. The contact capping layer 150 may completely cover the top surface of the first contact structure 140, and a top surface of the contact capping layer 150 may be at substantially the same level as the level LV2 of the top surface of the first interlayer dielectric 134.

The contact capping layer 150 may include a first capping layer 152, and the first capping layer 152 may be arranged on the first contact structure 140 to completely fill the remaining portion of the first contact hole 140H. The first capping layer 152 may function as a self-alignment mask in an etching process for a second contact hole 160H for forming a second contact structure 160. For example, the first capping layer 152 may include a material having high etch selectivity with respect to both the gate capping layer 128 and the first interlayer dielectric 134. In example embodiments, the first capping layer 152 may include silicon carbide. For example, the first capping layer 152 may include silicon carbide including carbon in an amount of 15 atomic percent (at %) or more, without being limited thereto.

As shown in FIG. 2B, the top surface of the first contact structure 140 may have a first width w11 in the first horizontal direction (X direction), a bottom surface of the contact capping layer 150 may have a second width w12 in first horizontal direction (X direction), and the second width w12 of the bottom surface of the contact capping layer 150 may be greater than the first width w11 of the top surface of the first contact structure 140. In addition, a sidewall 150S of the contact capping layer 150 may protrude outwards from a sidewall 140S of the first contact structure 140. As shown in FIGS. 2A to 2C, the sidewall 150S of the contact capping layer 150 may protrude outwards from the sidewall 140S of the first contact structure 140 in the first horizontal direction (X direction) and the second horizontal direction (Y direction). The protruding portion 150P may extend outward from a sidewall 140S of the first contact structure 140. A protruding portion 150P may be formed at the bottom of the contact capping layer 150 and may be surrounded by the first interlayer dielectric 134. The protruding portion 150P may be formed by laterally enlarging an upper portion of the first contact hole 140H and forming the first capping layer 152 in an enlarged upper region 140HE (see FIG. 10F) formed thereby. The first capping layer 152 may completely fill the enlarged upper region 140HE, a bottom surface of the first capping layer 152 may contact the top surface of the first contact structure 140, and a top surface of the first capping layer 152 may be at substantially the same level as the level LV2 of the top surface of the first interlayer dielectric 134. A portion of the bottom surface and a portion of a sidewall of the first capping layer 152 may form the protruding portion 150P. The protruding portion 150P may vertically overlap a portion of the gate spacer 126 of the gate structure 120.

A second interlayer dielectric 136 may be arranged on the contact capping layer 150 and the first interlayer dielectric 134.

The second contact structure 160 may be arranged on the gate structure 120 through the second interlayer dielectric 136 and the first interlayer dielectric 134. The second contact structure 160 may be arranged in the second contact hole 160H, the second contact hole 160H may extend up to the inside of the gate structure 120 through the second interlayer dielectric 136 and the first interlayer dielectric 134, and the top surface of the gate line GL may be exposed at the bottom of the second contact hole 160H.

The second contact structure 160 may include a second contact plug 162 and a second barrier layer 164. The second barrier layer 164 may surround a sidewall and a bottom surface of the second contact plug 162. The second contact plug 162 may include at least one of cobalt (Co), tungsten (W), nickel (Ni), ruthenium (Ru), copper (Cu), aluminum (Al), a silicide thereof, and an alloy thereof. The second barrier layer 164 may include at least one of ruthenium (Ru), titanium (Ti), titanium nitride (TiN), tantalum (Ta), tantalum nitride (TaN), tungsten (W), titanium silicon nitride (TiSiN), titanium silicide (TiSi), and tungsten silicide (WSi). A second insulating liner 166 may further arranged on a sidewall of the second contact hole 160H to surround a sidewall of the second contact structure 160.

As shown in FIG. 2A, the second contact structure 160 may have two sidewalls 160S that are apart from each other in the first horizontal direction (X direction), and at least a portion of each sidewall 160S may be surrounded by the contact capping layer 150 (e.g., at least a portion of each sidewall 160S may be around the contact capping layer 150). A first width w21 of the second contact structure 160 in the first horizontal direction (X direction) at the same level (that is, LV1) as the bottom surface of the contact capping layer 150 may be less than a second width w22 of the second contact structure 160 in the first horizontal direction (X direction) at the same level (that is, LV2) as the top surface of the contact capping layer 150. According to example embodiments, in an etching process of forming the second contact hole 160H, the contact capping layer 150 may function as a self-alignment mask, and thus, the contact capping layer 150 may be exposed at the sidewall of the second contact hole 160H. In particular, in the etching process set forth above, due to relatively high etch resistance of the contact capping layer 150, as the second contact hole 160H extends downwards, a bottom width of the second contact hole 160H may be less than a top width of the second contact hole 160H.

As shown in FIG. 2A, a portion of each sidewall 160S of the second contact structure 160 may face the contact capping layer 150 and may not encounter the protruding portion 150P of the contact capping layer 150. However, in other embodiments, the portion of each sidewall 160S of the second contact structure 160 may encounter the protruding portion 150P of the contact capping layer 150 with the second insulating liner 166 therebetween.

As the contact capping layer 150 may completely cover the top surface of the first contact structure 140 and protrudes outwards from the first contact structure 140, even though misalignment of a mask pattern occurs in a process of forming the second contact hole 160H, a sufficient separation distance between the first contact structure 140 and the second contact hole 160H may be secured. Thus, in the process of forming the second contact hole 160H, the first contact structure 140 may be prevented from being exposed.

A third interlayer dielectric 138 may be arranged on the second contact structure 160 and the second interlayer dielectric 136. A first via structure 172 may be connected to the first contact structure 140 through the third interlayer dielectric 138, the second interlayer dielectric 136, and the contact capping layer 150. A second via structure 174 may be connected to the second contact structure 160 through the third interlayer dielectric 138. The first via structure 172 may include a first via filling layer 172P and a first via barrier layer 172B. The second via structure 174 may include a second via filling layer 174P and a second via barrier layer 174B.

Generally, as a degree of integration of an integrated circuit device increases, the width and pitch of the gate line GL decrease, and thus, it may be difficult to secure electrical insulation between the first contact structure 140 and the second contact structure 160. For example, when misalignment of a mask pattern occurs in a photolithography process, the first contact structure 140 may be exposed in a process of forming the second contact structure 160, and thus, an electrical short-circuit may occur between the first contact structure 140 and the second contact structure 160. However, according to example embodiments, the second contact hole 160H may be formed by using, as a self-alignment mask, the contact capping layer 150 covering the top surface of the first contact structure 140. In particular, a sufficient separation distance between the second contact hole 160H and the first contact structure 140 may be secured due to the contact capping layer 150 protruding outwards from the sidewall 140S of the first contact structure 140.

In addition, as the top width of the second contact hole 160H is greater than the bottom width thereof, faults such as void generation and the like may be reduced or prevented in a process of forming the second contact structure 160 by filling the inside of the second contact hole 160H with a metal material.

Figure 3A:
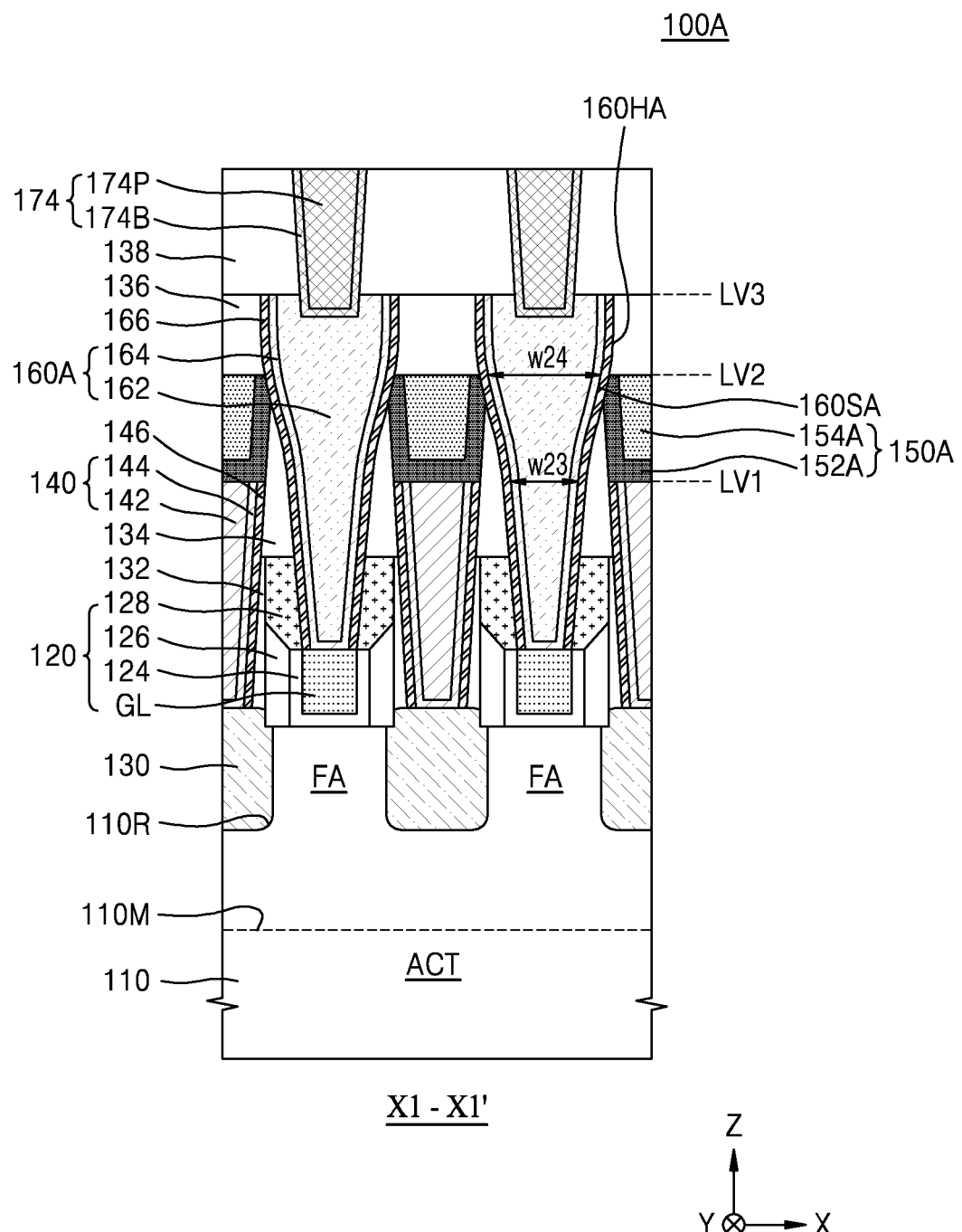
FIGS. 3A to 3C are cross-sectional views illustrating an integrated circuit device according to example embodiments.
Figure 3B:
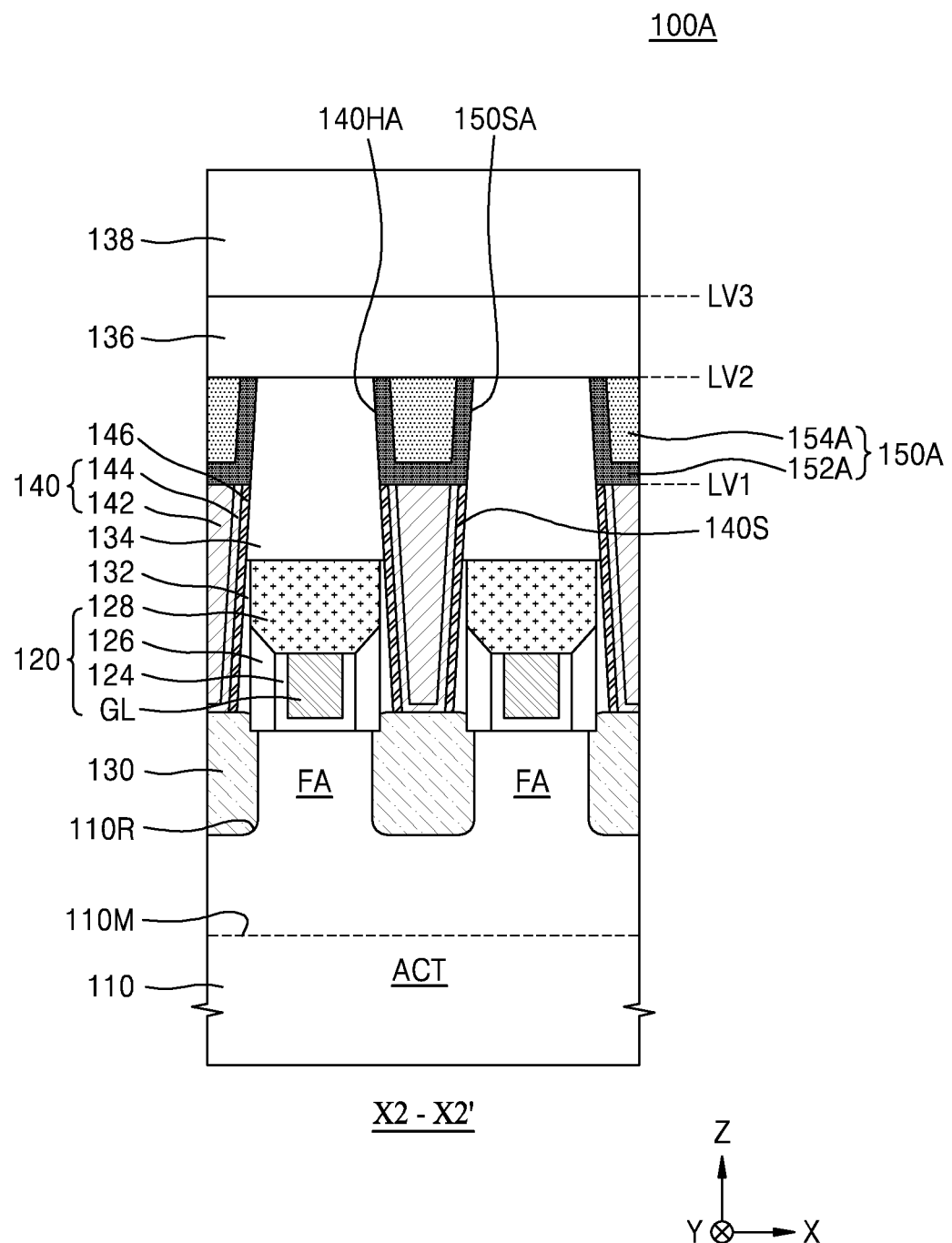
Figure 3C:
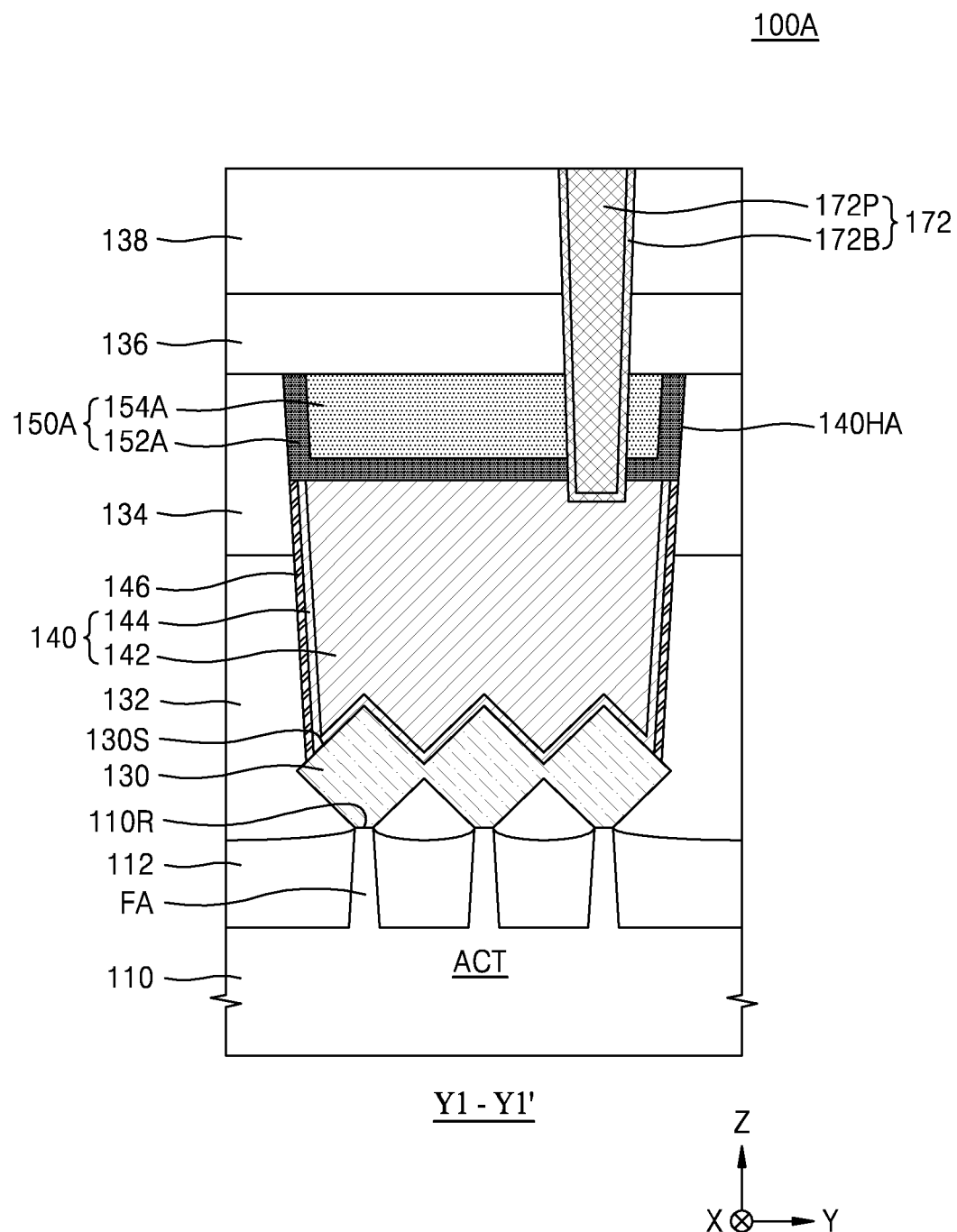

FIGS. 3A to 3C are cross-sectional views illustrating an integrated circuit device 100A according to example embodiments. Specifically, FIGS. 3A to 3C are cross-sectional views corresponding to cross-sections taken along the line X1-X1', the line X2-X2', and the line Y1-Y1' of FIG. 1, respectively. In FIGS. 3A to 3C, the same reference numerals as in FIGS. 1 to 2C respectively denote the same components.

Referring to FIGS. 3A to 3C, a contact capping layer 150A may fill an upper portion of a first contact hole 140HA and may include a first capping layer 152A and a second capping layer 154A, which are sequentially formed on the first contact structure 140.

As shown in FIGS. 3A and 3B, the first contact hole 140HA may have a sidewall having a substantially straight-line-shaped profile without a sharp change such as a step or a kink. Thus, a sidewall 150SA of the contact capping layer 150A may be collinear with a sidewall of the first insulating liner 146 (for example, an outer sidewall of the first insulating liner 146 surrounding the sidewall 140S of the first contact structure 140).

The first capping layer 152A may conformally cover the top surface of the first contact structure 140 and the sidewall of the first contact hole 140HA. The second capping layer 154A may be arranged on the first capping layer 152A to fill the remaining portion of the first contact hole 140HA. The first capping layer 152A may surround a portion of a sidewall 160SA of a second contact structure 160A.

The first capping layer 152A may be arranged in the first contact hole 140HA to surround a bottom surface and a sidewall of the second capping layer 154A, and thus, the second capping layer 154A may not be in contact with the first interlayer dielectric 134. The first capping layer 152A may function as a self-alignment mask in a process of forming the second contact structure 160A. The first capping layer 152A may include a material having high etch selectivity with respect to both the gate capping layer 128 and the first interlayer dielectric 134, or may include a material having relatively high etch resistance in a process of forming a second contact hole 160HA. In addition, the second capping layer 154A may include a material having lower etch resistance than the first capping layer 152A.

In example embodiments, the first capping layer 152A may include silicon carbide including carbon in a first amount, and the second capping layer 154A may include silicon carbide including carbon in a second amount. In some examples, the first amount may be greater than about 15 at %, and the second amount may be less than about 15 at %.

In other embodiments, the first capping layer 152A may include silicon carbide including carbon in a first amount, and the second capping layer 154A may include at least one of silicon oxide, silicon oxynitride, and silicon nitride. In some examples, the first amount may be greater than about 15 at %.

As shown in FIG. 3A, the second contact structure 160A may have two sidewalls 160SA that are apart from each other in the first horizontal direction (X direction), and at least a portion of each sidewall 160SA may be surrounded by the contact capping layer 150A (for example, the first capping layer 152A). A first width w23 of the second contact structure 160A in the first horizontal direction (X direction) at the same level (that is, LV1) as a bottom surface of the contact capping layer 150A may be less than a second width w24 of the second contact structure 160A in the first horizontal direction (X direction) at the same level (that is, LV2) as a top surface of the contact capping layer 150A.

According to example embodiments, in an etching process of forming the second contact hole 160HA, the contact capping layer 150A may function as a self-alignment mask, and thus, the contact capping layer 150A may be exposed at a sidewall of the second contact hole 160HA. In particular, due to relatively high etch resistance of the first capping layer 152A exposed in the etching process set forth above, as the second contact hole 160HA enlarges downwards, a bottom width of the second contact hole 160HA may be less than a top width thereof. Therefore, even though misalignment of a mask pattern occurs in a process of forming the second contact hole 160HA, a sufficient separation distance between the first contact structure 140 and the second contact hole 160HA may be secured, and the first contact structure 140 may be prevented from being exposed in the process of forming the second contact hole 160HA.

Although FIG. 3A illustrates an example in which the second contact hole 160HA is surrounded only by the first capping layer 152A and is not in contact with the second capping layer 154A, unlike the example shown in FIG. 3A, when an upper portion of the second contact hole 160HA is further enlarged or a center of the second contact hole 160HA is apart from a center of the gate line GL in the first horizontal direction (X direction), a portion of the sidewall 160SA of the second contact structure 160A may contact both the first capping layer 152A and the second capping layer 154A. Even in this case, since the bottom width of the second contact hole 160HA may be less than the top width thereof due to the high etch resistance of the first capping layer 152A, the separation distance between the first contact structure 140 and the second contact hole 160HA may be secured.

The first via structure 172 may be connected to the first contact structure 140 through the third interlayer dielectric 138, the second interlayer dielectric 136, the second capping layer 154A, and the first capping layer 152A.

Figure 4A:
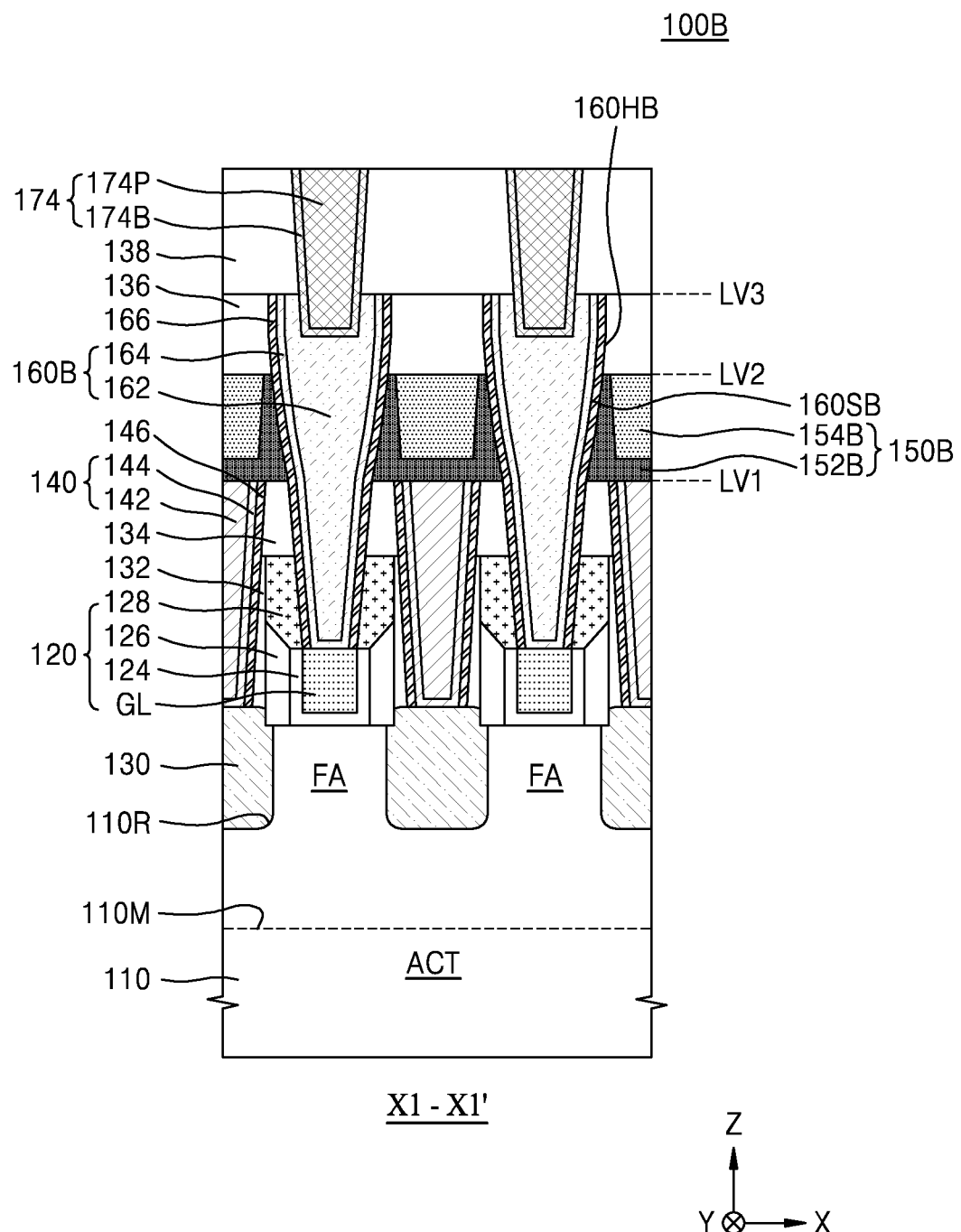
FIGS. 4A to 4C are cross-sectional views illustrating an integrated circuit device according to example embodiments.
Figure 4B:
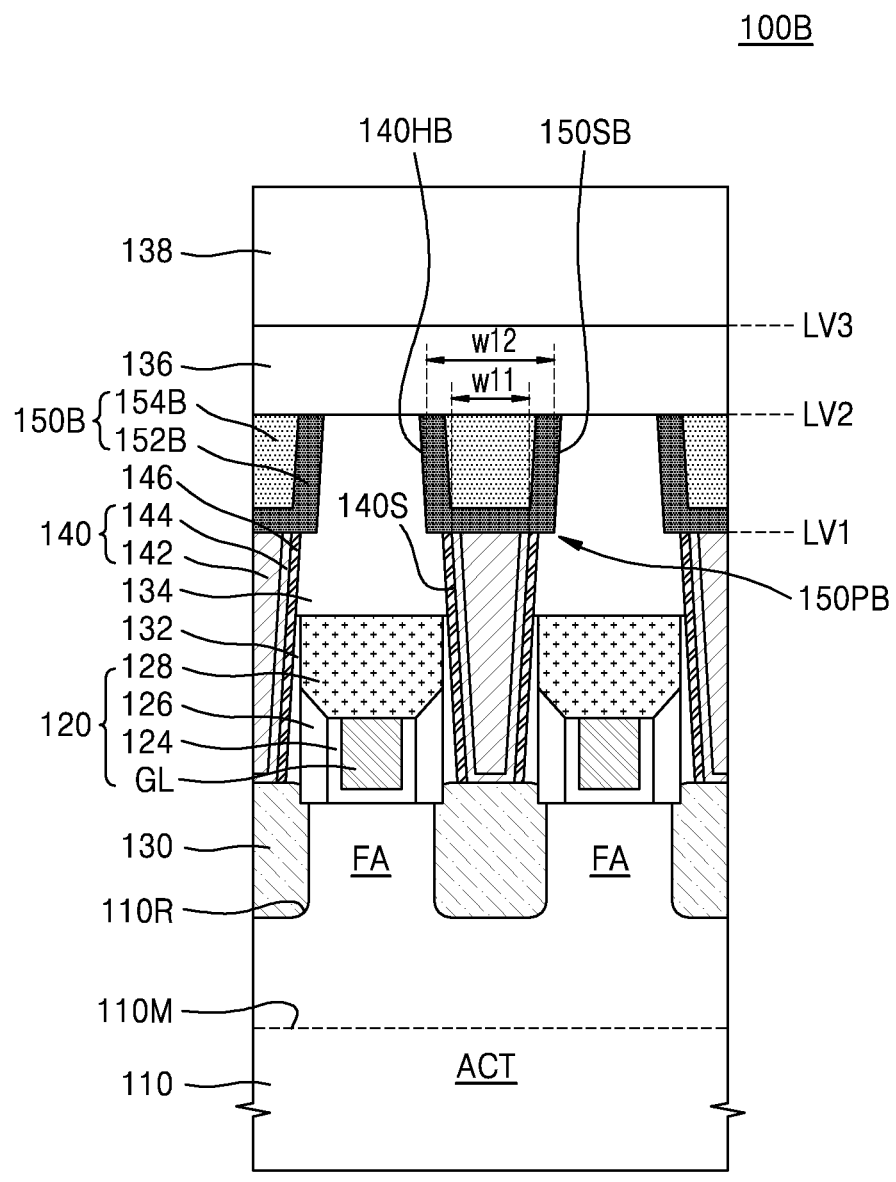
Figure 4C:
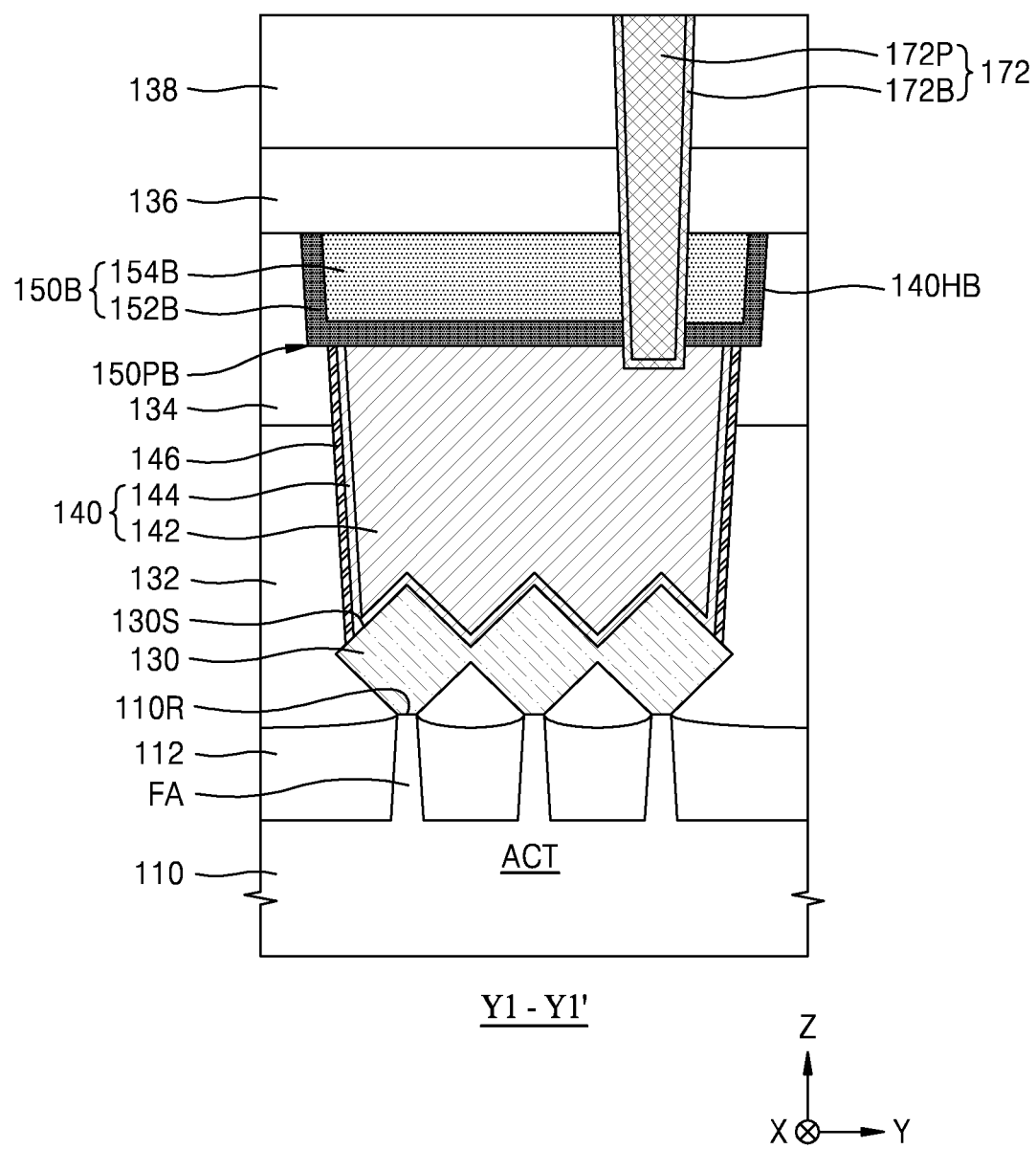

FIGS. 4A to 4C are cross-sectional views illustrating an integrated circuit device 100B according to example embodiments. Specifically, FIGS. 4A to 4C are cross-sectional views corresponding to cross-sections taken along the line X1-X1', the line X2-X2', and the line Y1-Y1' of FIG. 1, respectively. In FIGS. 4A to 4C, the same reference numerals as in FIGS. 1 to 3C respectively denote the same components.

Referring to FIGS. 4A to 4C, a contact capping layer 150B may include a first capping layer 152B and a second capping layer 154B, which are sequentially formed on the first contact structure 140, and the contact capping layer 150B may have a sidewall 150SB protruding outwards from the sidewall 140S of the first contact structure 140. The first capping layer 152B may be conformally arranged on the top surface of the first contact structure 140 and a sidewall of a first contact hole 140HB and surround a sidewall and a bottom surface of the second capping layer 154B. A protruding portion 150PB may be arranged at the same level as the bottom surface of the second capping layer 154B to be apart from the sidewall 140S of the first contact structure 140 in the first horizontal direction (X direction).

According to example embodiments, the first contact structure 140 may be formed in the first contact hole 140HB, followed by exposing an upper portion of the first contact hole 140HB again by removing an upper portion of the first contact structure 140, and then, the first contact hole 140HB may be laterally enlarged. In this case, an additional photolithography process may not be needed for forming the contact capping layer 150B, and there is no risk of the occurrence of misalignment between the contact capping layer 150B and the first contact structure 140, or the like. Thus, both sidewalls of the enlarged upper region 140HE (see FIG. 10F) of the first contact hole 140HB, which are apart from each other in the first horizontal direction (X direction), may be respectively apart from both sidewalls 140S of the first contact structure 140 by as much as a substantially equal distance. In other words, as shown in FIG. 4B, both protruding portions 150PB arranged on both sidewalls 150SB of the contact capping layer 150B may be respectively apart from both sidewalls 140S of the first contact structure 140 by as much as a substantially equal distance.

A second contact structure 160B may have two sidewalls 160SB that are apart from each other in the first horizontal direction (X direction). At least a portion of each sidewall 160SB may be surrounded by the first capping layer 152B. According to example embodiments, in an etching process of forming a second contact hole 160HB, the first capping layer 152B may function as a self-alignment mask, and thus, the first capping layer 152B may be exposed at a sidewall of the second contact hole 160HB. In particular, due to relatively high etch resistance of the first capping layer 152B in the etching process set forth above, a bottom width of the second contact hole 160HB may be less than a top width of thereof.

In addition, as both protruding portions 150PB arranged on both sidewalls 150SB of the contact capping layer 150B are respectively apart from both sidewalls 140S of the first contact structure 140 by as much as a substantially equal distance, even though misalignment of a mask pattern occurs in a process of forming the second contact hole 160HB, a sufficient separation distance between the first contact structure 140 and the second contact hole 160HB may be secured. Therefore, in the process of forming the second contact hole 160HB, the first contact structure 140 may be prevented from being exposed.

Figure 5A:
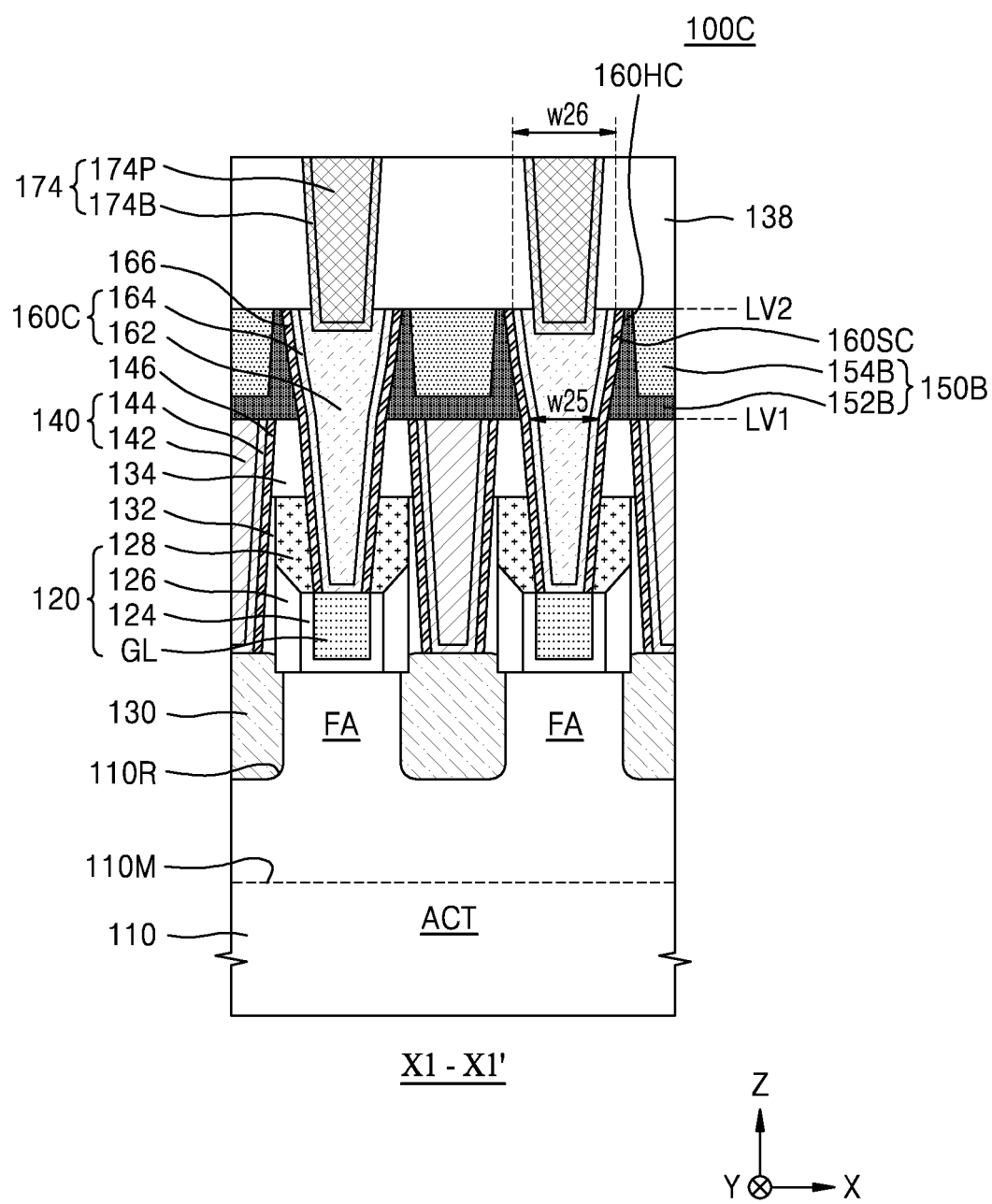
FIGS. 5A to 5C are cross-sectional views illustrating an integrated circuit device according to example embodiments.
Figure 5B:
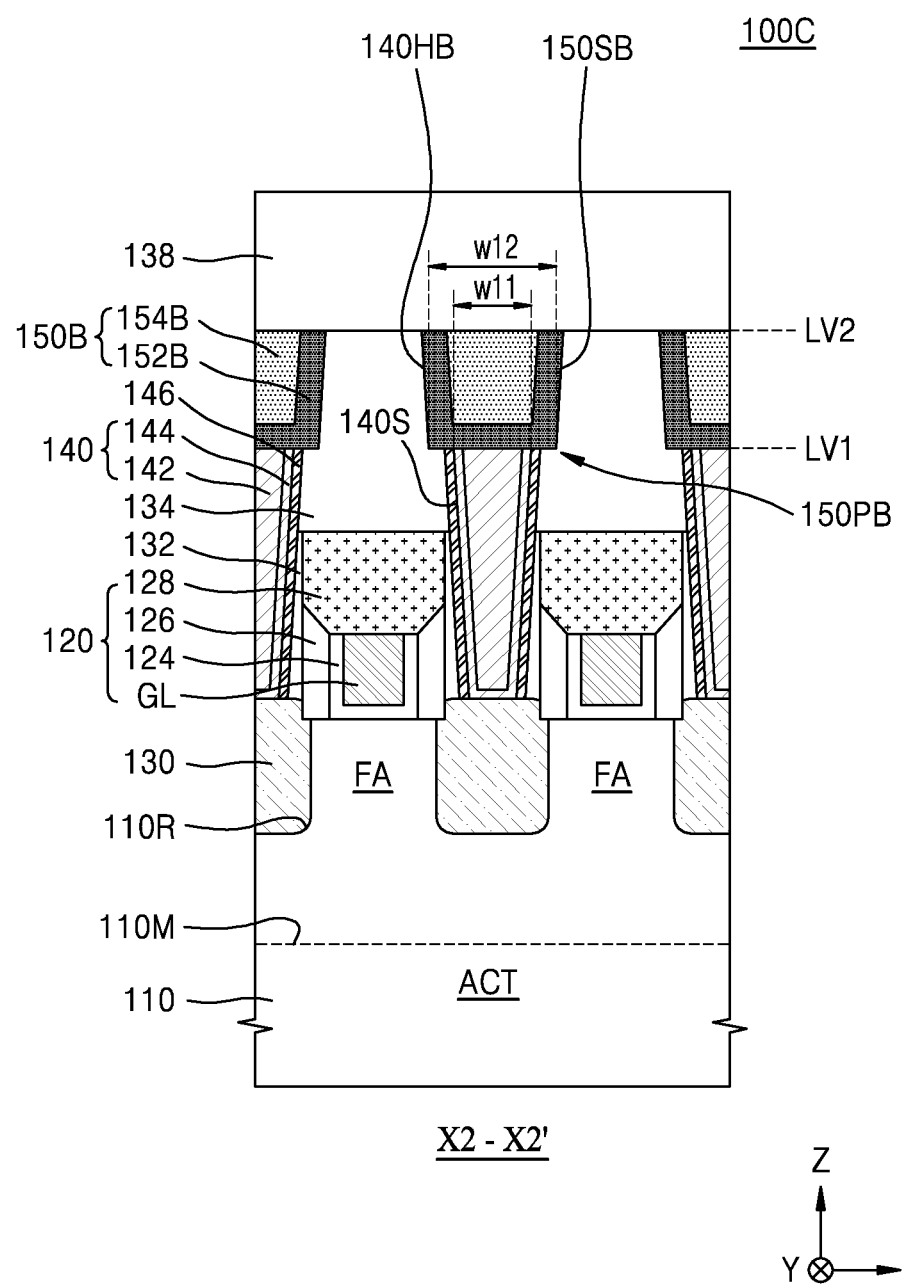
Figure 5C:
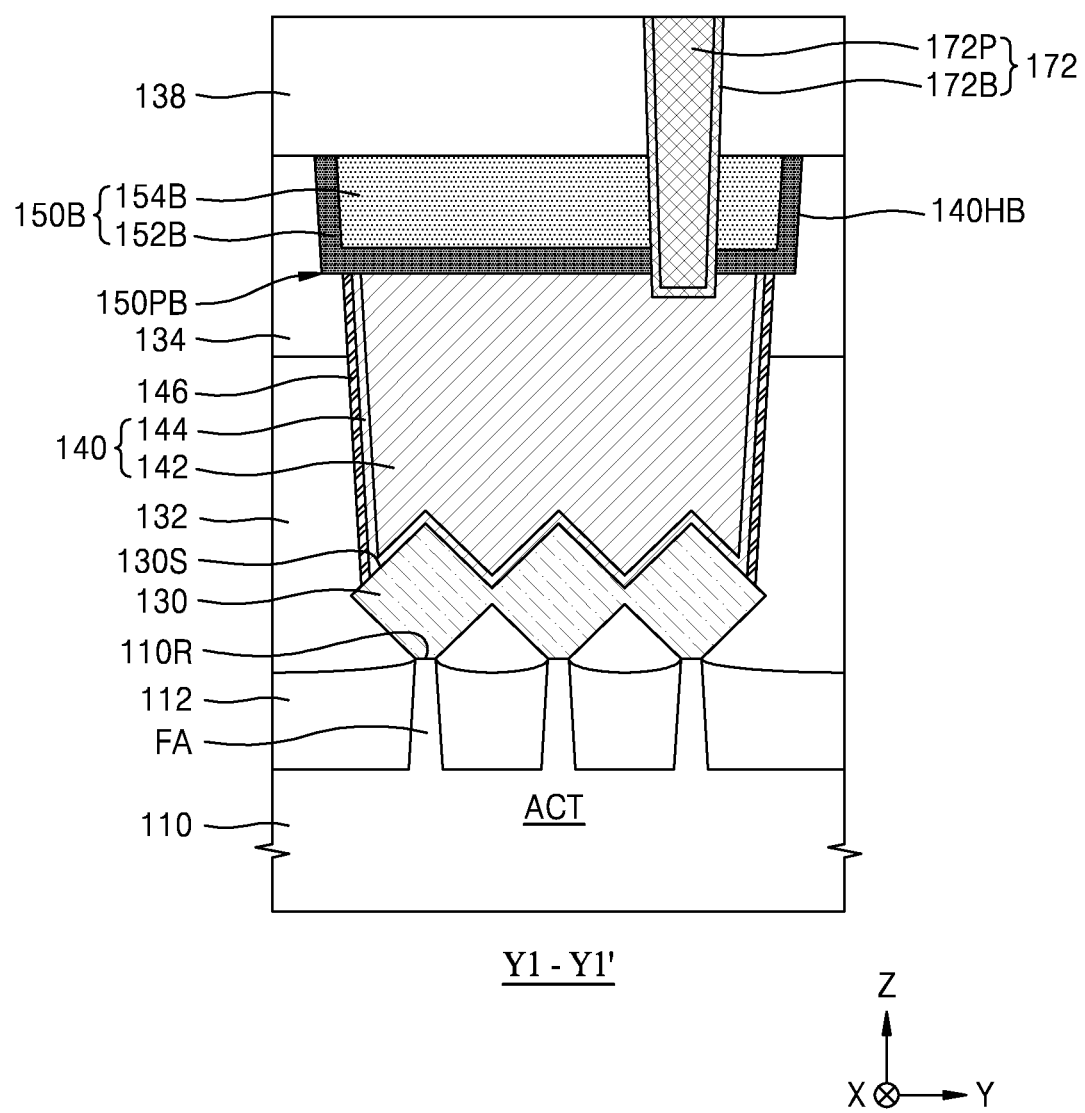

FIGS. 5A to 5C are cross-sectional views illustrating an integrated circuit device 100C according to example embodiments. Specifically, FIGS. 5A to 5C are cross-sectional views corresponding to cross-sections taken along the line X1-X1', the line X2-X2', and the line Y1-Y1' of FIG. 1, respectively. In FIGS. 5A to 5C, the same reference numerals as in FIGS. 1 to 4C respectively denote the same components.

Referring to FIGS. 5A to 5C, a top surface of a second contact structure 160C may be at the same level as a top surface of the contact capping layer 150B and be at the same level as the level LV2 of the top surface of the first interlayer dielectric 134, as shown in FIG. 5A, for example. The third interlayer dielectric 138 may be arranged on the second contact structure 160C, the contact capping layer 150B, and the first interlayer dielectric 134, and the second interlayer dielectric 136 which have been described with reference to FIGS. 4A to 4C may be omitted.

According to example embodiments, the second contact structure 160C may be formed in a second contact hole 160HC, which penetrates the second interlayer dielectric 136 and the first interlayer dielectric 134, followed by removing the second interlayer dielectric 136 and an upper portion of the second contact structure 160C by a chemical mechanical polishing (CMP) process or the like such that the top surface of each of the first interlayer dielectric 134 and the contact capping layer 150B are exposed, whereby the top surface of the second contact structure 160C may be coplanar with the top surface of the contact capping layer 150B.

According to some embodiments, a mask pattern 320 (see FIG. 10H) may be formed directly on the first interlayer dielectric 134 and the contact capping layer 150B, followed by etching the first interlayer dielectric 134 by using the mask pattern 320 as an etch mask, thereby forming the second contact hole 160HC. Here, a top surface of the first capping layer 152B may be partially exposed by the mask pattern 320, and due to the relatively high etch resistance of the first capping layer 152B in the etching process set forth above, a bottom width of the second contact hole 160HC may be less than a top width thereof.

As shown in FIG. 5A, the second contact structure 160C may have two sidewalls 160SC that are apart from each other in the first horizontal direction (X direction), and at least a portion of each sidewall 160SC may be surrounded by the contact capping layer 150B (for example, the first capping layer 152B). A first width w25 of the second contact structure 160C in the first horizontal direction (X direction) at the same level (that is, LV1) as a bottom surface of the contact capping layer 150B may be less than a second width w26 of the second contact structure 160C in the first horizontal direction (X direction) at the same level (that is, LV2) as the top surface of the contact capping layer 150B.

Figure 6A:
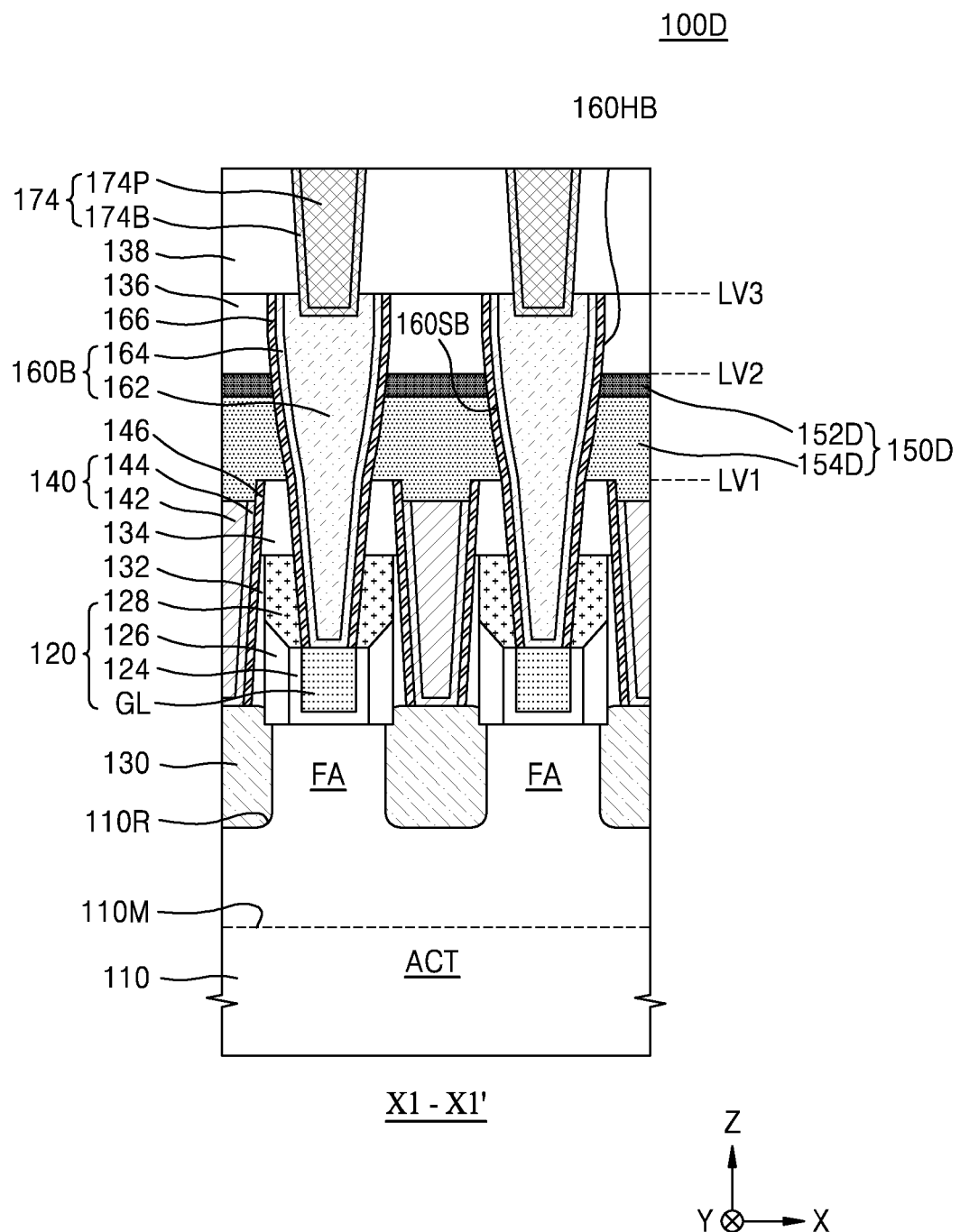
FIGS. 6A to 6C are cross-sectional views illustrating an integrated circuit device according to example embodiments.
Figure 6B:
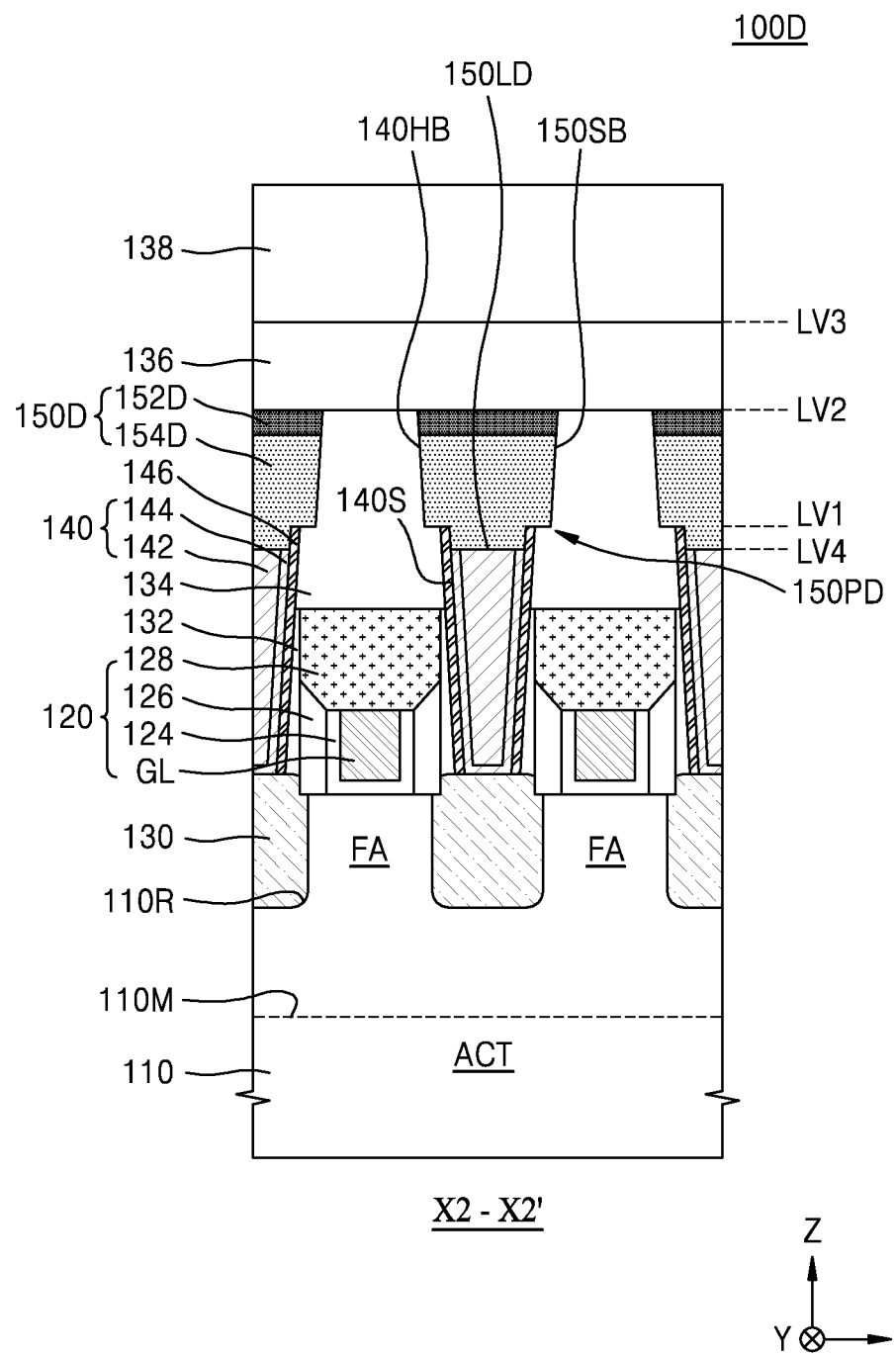
Figure 6C:
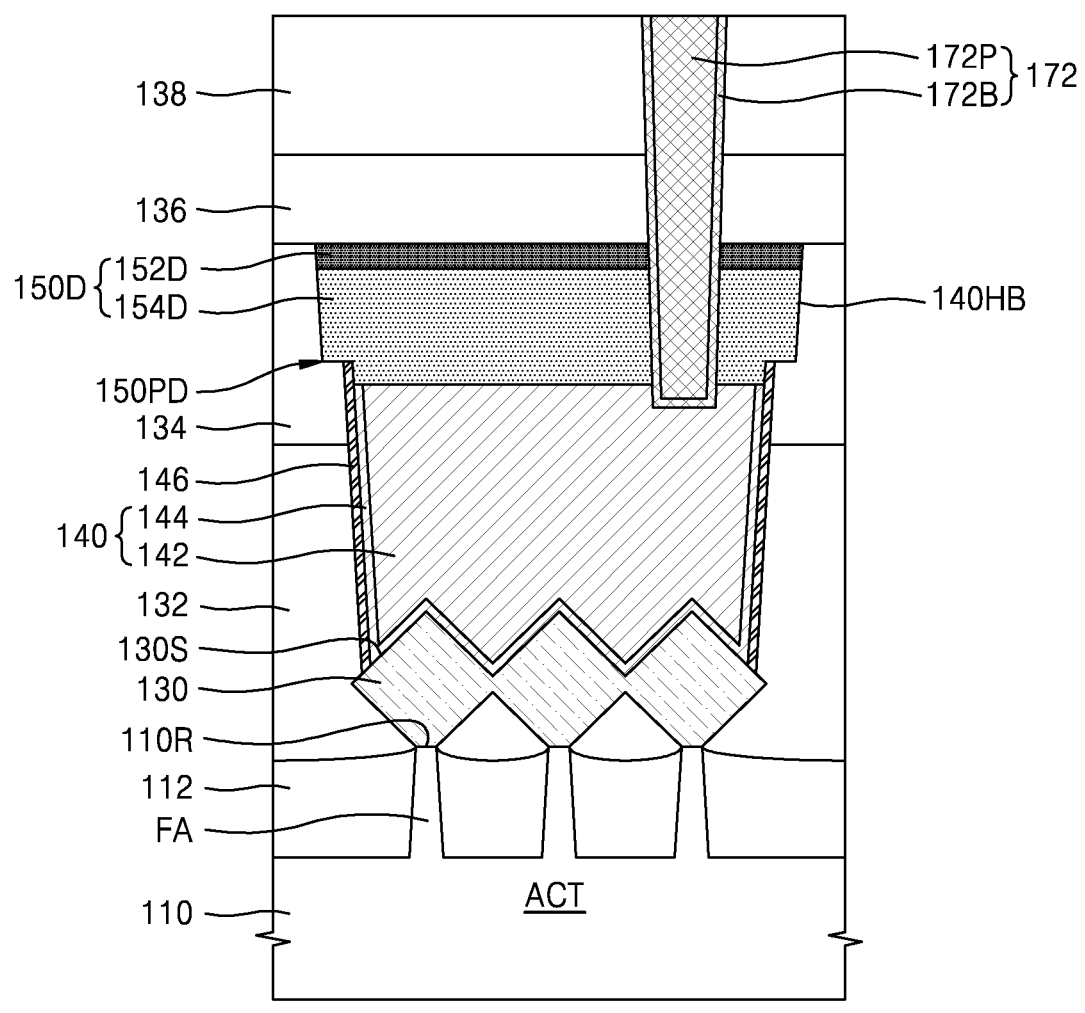

FIGS. 6A to 6C are cross-sectional views illustrating an integrated circuit device 100D according to example embodiments. Specifically, FIGS. 6A to 6C are cross-sectional views corresponding to cross-sections taken along the line X1-X1', the line X2-X2', and the line Y1-Y1' of FIG. 1, respectively. In FIGS. 6A to 6C, the same reference numerals as in FIGS. 1 to 5C respectively denote the same components.

Referring to FIGS. 6A to 6C, a contact capping layer 150D may include a second capping layer 154D and a first capping layer 152D, which are sequentially stacked in the first contact hole 140HB. The second capping layer 154D may contact the top surface of the first contact structure 140, and the first capping layer 152D may be arranged on the second capping layer 154D and may not contact the first contact structure 140. The top surface of the first contact structure 140 may be at a lower level (that is, LV4) than a top surface of the first insulating liner 146, and a bottom surface 150LD of the contact capping layer 150D may be at a lower level (that is, LV4) than a protruding portion 150PD or the top surface of the first insulating liner 146.

According to example embodiments, the first contact structure 140 may fill the inside of the first contact hole 140HB, followed by removing an upper portion of the first contact structure 140, thereby exposing an upper portion of the first contact hole 140HB again. Here, less of the first insulating liner 146 may be removed than the first contact structure 140 due to a difference in etch resistance between the first insulating liner 146 and the first contact structure 140. The top surface of the first insulating liner 146 may be at a higher level than the top surface of the first contact structure 140. Next, the first contact hole 140HB may be laterally enlarged, and the second capping layer 154D may fill the inside of the first contact hole 140HB. An upper sidewall of the first contact hole 140HB may be exposed again by removing an upper portion of the second capping layer 154D, followed by filling the remaining portion of the first contact hole 140HB with the first capping layer 152D.

Figure 7:
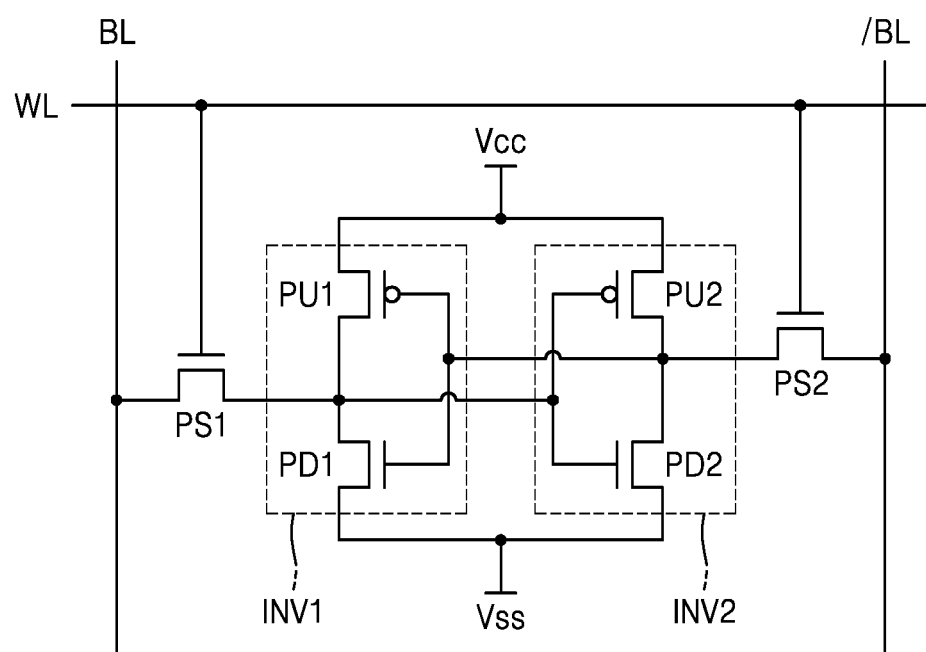
FIG. 7 is an equivalent circuit diagram illustrating an integrated circuit device according to example embodiments.

FIG. 7 is an equivalent circuit diagram illustrating an integrated circuit device 200 according to example embodiments. FIG. 7 illustrates a circuit diagram of a 6T static random access memory (SRAM) cell including 6 transistors.

Referring to FIG. 7, the integrated circuit device 200 may include a pair of inverters, that is, first and second inverters INV1 and INV2, which are connected in parallel between a power supply node Vcc and a ground node Vss, and a first pass transistor PS1 and a second pass transistor PS2, which are respectively connected to output nodes of the first and second inverters INV1 and INV2. The first pass transistor PS1 and the second pass transistor PS2 may be respectively connected to a bit line BL and a complementary bit line /BL. A gate of each of the first pass transistor PS1 and the second pass transistor PS2 may be connected to a word line WL.

The first inverter INV1 includes a first pull-up transistor PU1 and a first pull-down transistor PD1, which are connected in series, and the second inverter INV2 includes a second pull-up transistor PU2 and a second pull-down transistor PD2, which are connected in series. Each of the first pull-up transistor PU1 and the second pull-up transistor PU2 may include a PMOS transistor, and each of the first pull-down transistor PD1 and the second pull-down transistor PD2 may include an NMOS transistor.

For the first inverter INV1 and the second inverter INV2 to constitute one latch circuit, an input node of the first inverter INV1 may be connected to an output node of the second inverter INV2, and an input node of the second inverter INV2 may be connected to an output node of the first inverter INV1.

Figure 8:
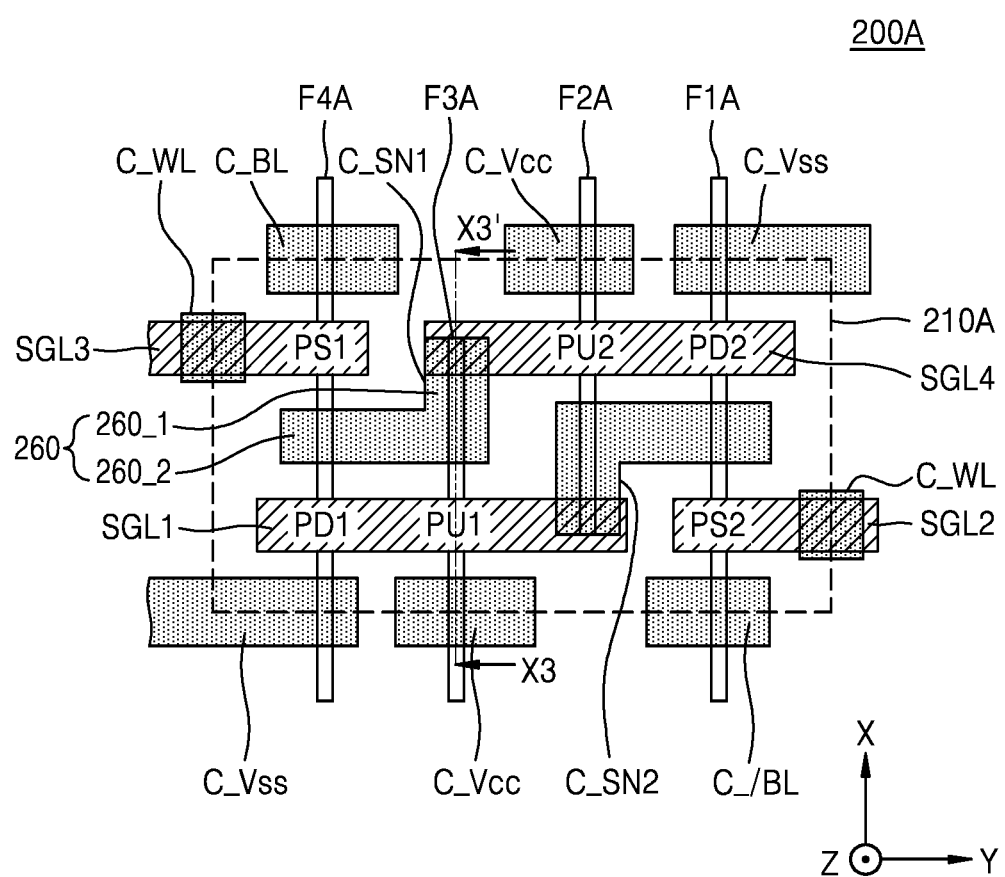
FIG. 8 is a layout diagram of an integrated circuit device according to example embodiments.
Figure 9:
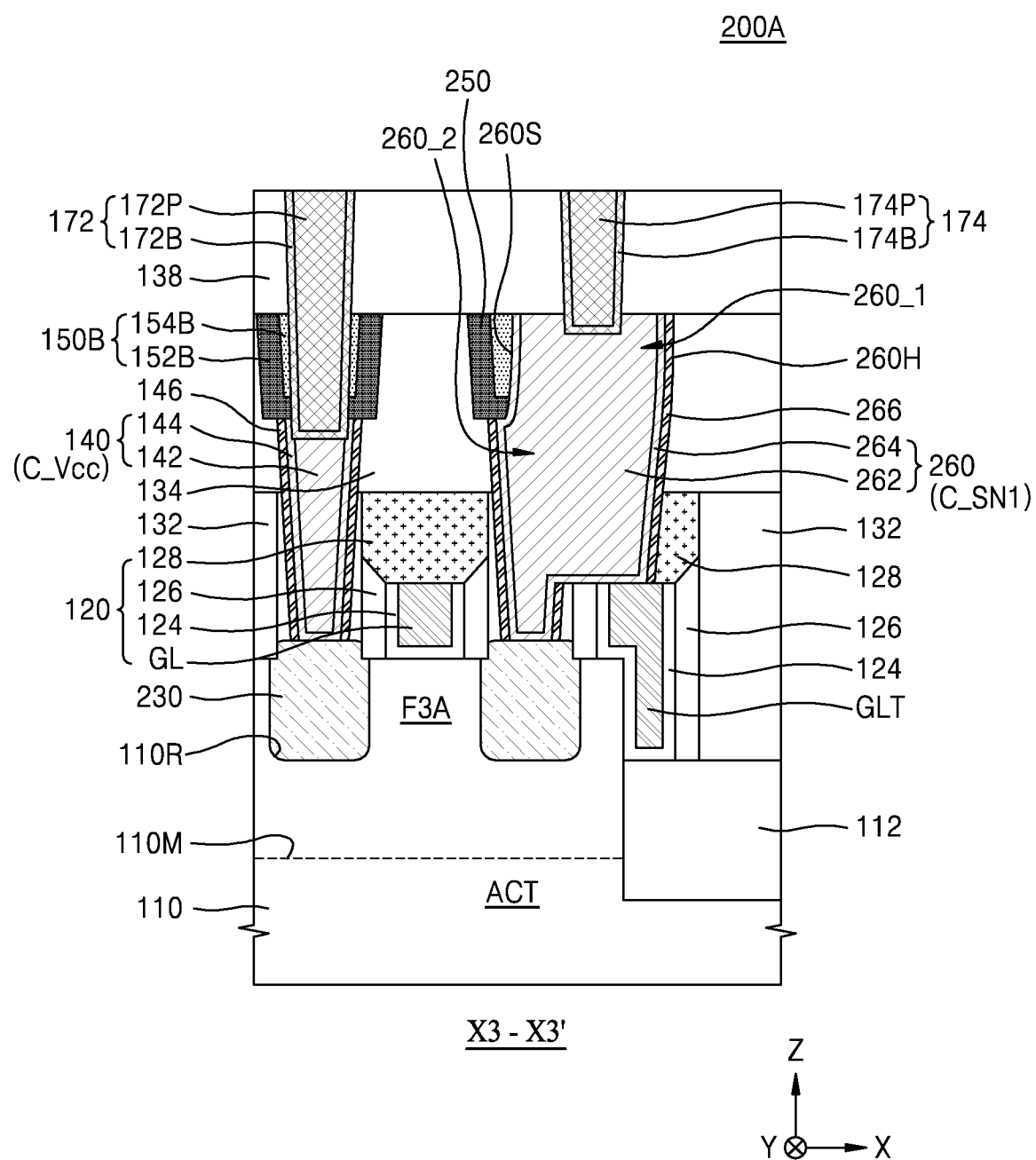
FIG. 9 is a cross-sectional view taken along a line X3-X3' of FIG. 8, according to example embodiments.

FIG. 8 is a layout diagram of an integrated circuit device 200A according to example embodiments. FIG. 9 is a cross-sectional view taken along a line X3-X3' of FIG. 8. In FIGS. 8 and 9, the same reference numerals as in FIGS. 1 to 7 respectively denote the same components.

Referring to FIGS. 8 and 9, the integrated circuit device 200A may include SRAM cells 210A arranged on the substrate 110. An SRAM cell 210A may include six (6) fin field effect transistors (finFETs).

The SRAM cell 210A includes a plurality of fin-type active regions F1A, F2A, F3A, and/or F4A, which extend parallel to each other in the first horizontal direction (X direction). Each of the plurality of fin-type active regions F1A, F2A, F3A, and F4A may protrude from the top surface of the substrate 110 in the Z direction.

In addition, the SRAM cell 210A may include a plurality of gate lines SGL1, SGL2, SGL3, and SGL4, which extend parallel to each other in the second horizontal direction (Y direction) intersecting the first horizontal direction (X direction) and may cover or overlap one or both sidewalls and top surfaces of the plurality of fin-type active regions F1A, F2A, F3A, and F4A. Each of the plurality of gate lines SGL1, SGL2, SGL3, and SGL4 may have similar features to the gate line GL described with reference to FIGS. 1 to 2C. A gate cut insulating layer (not shown) may be arranged between two gate lines placed in a line in the second horizontal direction (Y direction) among the plurality of gate lines SGL1, SGL2, SGL3, and SGL4.

Each of the first pull-up transistor PU1, the first pull-down transistor PD1, the first pass transistor PS1, the second pull-up transistor PU2, the second pull-down transistor PD2, and the second pass transistor PS2, which are included in the SRAM cell 210A, may be implemented as a fin-type transistor. In particular, each of the first pull-up transistor PU1 and the second pull-up transistor PU2 may include a PMOS transistor, and each of the first pull-down transistor PD1, the second pull-down transistor PD2, the first pass transistor PS1, and the second pass transistor PS2 may include an NMOS transistor.

A transistor may be formed at each of intersection points at which the plurality of fin-type active regions F1A, F2A, F3A, and F4A extending in the first horizontal direction (X direction) intersect with the plurality of gate lines SGL1, SGL2, SGL3, and SGL4 extending in the second horizontal direction (Y direction).

The first pass transistor PS1 may be formed at an intersection point between the fin-type active region F4A and the gate line SGL3, and the second pass transistor PS2 may be formed at an intersection point between the fin-type active region F1A and the gate line SGL2. The first pull-down transistor PD1 may be formed at an intersection point between the fin-type active region F4A and the gate line SGL1, and the second pull-down transistor PD2 may be formed at an intersection point between the fin-type active region F1A and the gate line SGL4. The first pull-up transistor PU1 may be formed at an intersection point between the fin-type active region F3A and the gate line SGL1, and the second pull-up transistor PU2 may be formed at an intersection point between the fin-type active region F2A and the gate line SGL4.

As illustrated in FIG. 8 as an example, various contact structures may be arranged in the SRAM cell 210A. Specifically, a word line contact C_WL may be connected to the gate line SGL3 of the first pass transistor PS1, and another word line contact C_WL may be connected to the gate line SGL2 of the second pass transistor PS2. A bit line contact C_BL may be connected to a drain of the first pass transistor PS1, and a complementary bit line contact C_/BL may be connected to a drain of the second pass transistor PS2. A power supply node contact C_Vcc may be connected to a source of the first pull-up transistor PU1, and another power supply node contact C_Vcc may be connected to a source of the second pull-up transistor PU2. A ground node contact C_Vss may be connected to a source of the first pull-down transistor PD1, and another ground node contact C_Vss may be connected to a source of the second pull-down transistor PD2. A first storage node contact C_SN1 may be connected to a source of the first pass transistor PS1 and a drain of each of the first pull-up transistor PU1 and the first pull-down transistor PD1. A second storage node contact C_SN2 may be connected to a source of the second pass transistor PS2 and a drain of each of the second pull-up transistor PU2 and the second pull-down transistor PD2.

Each of the power supply node contact C_Vcc, the ground node contact C_Vss, the bit line contact C_BL, and the complementary bit line contact C_/BL may include the first contact structure 140, as shown for example, in FIGS. 6A to 6C. Each of the power supply node contact C_Vcc, the ground node contact C_Vss, the bit line contact C_BL, and the complementary bit line contact C_/BL may be arranged on a source/drain region 230 extending from one of the plurality of fin-type active regions F1A, F2A, F3A, and F4A. The contact capping layer 150B may be arranged on the first contact structure 140, and the sidewall 150SB (see FIG. 4B) of the contact capping layer 150B may protrude outwards from the sidewall 140S (see FIG. 4B) of the first contact structure 140.

The word line contact C_WL may include the second contact structure 160B (see FIG. 4A). The second contact structure 160B may be electrically connected to the gate line SGL2 or SGL3. A portion of the sidewall 160SB (see FIG. 4A) of the second contact structure 160B may be surrounded by the contact capping layer 150B.

Each of the first storage node contact C_SN1 and the second storage node contact C_SN2 may include a third contact structure 260. The third contact structure 260 may be formed in a third contact hole 260H and may include a third contact plug 262 and a third barrier layer 264.

The third contact structure 260 may include a first portion 260_1 extending in the first horizontal direction (X direction) and a second portion 260_2 extending in the second horizontal direction (Y direction) and may have an L-shaped horizontal cross-section. The first portion 260_1 may vertically overlap the gate line GL, and the second portion 260_2 may vertically overlap the source/drain region 230 adjacent to the gate line GL. As illustrated in FIGS. 8 and 9 as an example, the second portion 260_2 may be arranged on source/drain regions 230 respectively extending from two adjacent fin-type active regions among the plurality of fin-type active regions F1A, F2A, F3A, and F4A. The first portion 260_1 of the third contact structure 260 may have an asymmetrical shape with respect to the first horizontal direction (X direction). A sidewall 260S of the second portion 260_2 of the third contact structure 260 may be surrounded by a contact capping layer 250.

The third contact hole 260H may expose a top surface of the gate line SGL1 or SGL4 and a top surface of the source/drain region 230 adjacent thereto. As shown in FIG. 9, a portion of the gate line GL, which is exposed by the third contact hole 260H, may have a tail GLT extending in the vertical direction (Z direction) along a profile of a sidewall of the fin-type active region F3A, and the tail GLT may be arranged over the isolation layer 112. However, the inventive concept is not limited thereto.

FIGS. 10A to 10M are cross-sectional views illustrating a method of fabricating the integrated circuit device 100B, according to example embodiments.

FIGS. 10A to 10M respectively illustrate cross-sectional views corresponding to the cross-section taken along the line X1-X1' of FIG. 1, according to a process order. In FIGS. 10A to 10M, the same reference numerals as in FIGS. 1 to 9 respectively denote the same components.

Figure 10A:
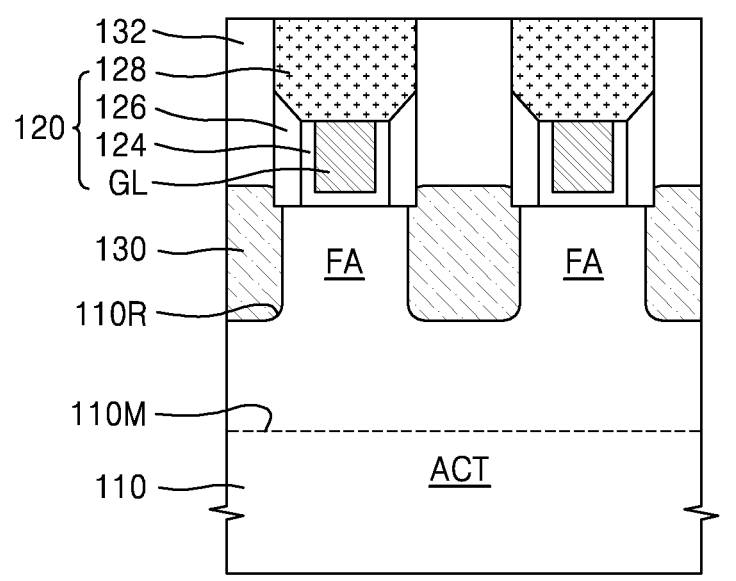
FIGS. 10A to 10M are cross-sectional views illustrating a method of fabricating an integrated circuit device, according to example embodiments.

Referring to FIG. 10A, the fin-type active region FA may be formed by partially etching the active region ACT of the substrate 110, the fin-type active region FA protruding from the top surface 110M of the substrate 110 in the vertical direction and extending in the first horizontal direction (X direction).

The isolation layer 112 (see FIG. 2C) may be formed on the substrate 110 to cover both sidewalls of the fin-type active region FA. Although not shown, an interfacial layer (not shown) may be further formed between the isolation layer 112 and the fin-type active region FA, the interfacial layer conformally covering the sidewalls of the fin-type active region FA.

Next, a stack structure of a sacrificial gate insulating layer pattern (not shown), a sacrificial gate (not shown), and a hard mask pattern (not shown) may be formed on the substrate 110, followed by forming the gate spacer 126 on a sidewall of the stack structure. The gate spacer 126 may include silicon nitride, without being limited thereto.

Next, portions of the fin-type active region FA, which are on both sides with respect to the stack structure and both gate spacers 126, may be etched, thereby forming the recess region 110R. In example embodiments, a process of forming the recess region 110R may include a dry etching process, a wet etching process, or a combination thereof.

In the process of forming the recess region 110R, a portion of the fin-type active region FA under the gate spacer 126 may be further removed, whereby the recess region 110R may be laterally enlarged, and a portion of the recess region 110R may vertically overlap a portion of the gate spacer 126.

Next, the source/drain region 130 may be formed on an inner wall of the recess region 110R. The source/drain region 130 may be formed by an epitaxy process by using, as a seed layer, a sidewall of the fin-type active region FA and the top surface of the substrate 110, which are exposed at the inner wall of the recess region 110R. The epitaxy process may include a chemical vapor deposition (CVD) process, such as a vapor-phase epitaxy process or ultra-high vacuum CVD (UHV-CVD) process, a molecular beam epitaxy process, and/or a combination thereof. In the epitaxy process, the source/drain region 130 may be formed at a process pressure of about 50 Torr to about 400 Torr by using a liquid-phase or vapor-phase precursor as a precursor needed to form the source/drain region 130. In the epitaxy process of forming the source/drain region 130, first impurities may be doped in situ into the source/drain region 130.

The source/drain region 130 may include a lower semiconductor layer (not shown), an upper semiconductor layer (not shown), and a capping semiconductor layer (not shown). In respective processes for forming the lower semiconductor layer, the upper semiconductor layer, and the capping semiconductor layer, different precursor supply concentrations and different impurity doping concentrations may be used.

Next, an insulating layer (not shown) may be formed over the substrate 110 to cover the stack structure, the gate spacer 126, and the source/drain region 130, followed by planarizing the insulating layer such that a top surface of each of the stack structure and the gate spacer 126 is exposed, thereby forming the inter-gate dielectric 132.

Next, the hard mask pattern, the sacrificial gate, and the sacrificial gate insulating layer pattern may be removed, followed by forming the gate insulating layer 124 on the fin-type active region FA and inner walls of a pair of gate spacers 126. Next, a conductive layer (not shown) may be formed on the gate insulating layer 124 to fill a space between the pair of gate spacers 126, followed by performing etch-back on an upper portion of the conductive layer, thereby forming the gate line GL. Next, an insulating layer (not shown) may be formed on the gate line GL and the inter-gate dielectric 132 to fill the remaining space between the pair of gate spacers 126, followed by removing an upper portion of the insulating layer such that a top surface of the inter-gate dielectric 132 is exposed, thereby forming the gate capping layer 128. Thus, the gate structure 120, which includes the gate line GL, the gate insulating layer 124, the gate spacer 126, and the gate capping layer 128, may be formed.

Figure 10B:
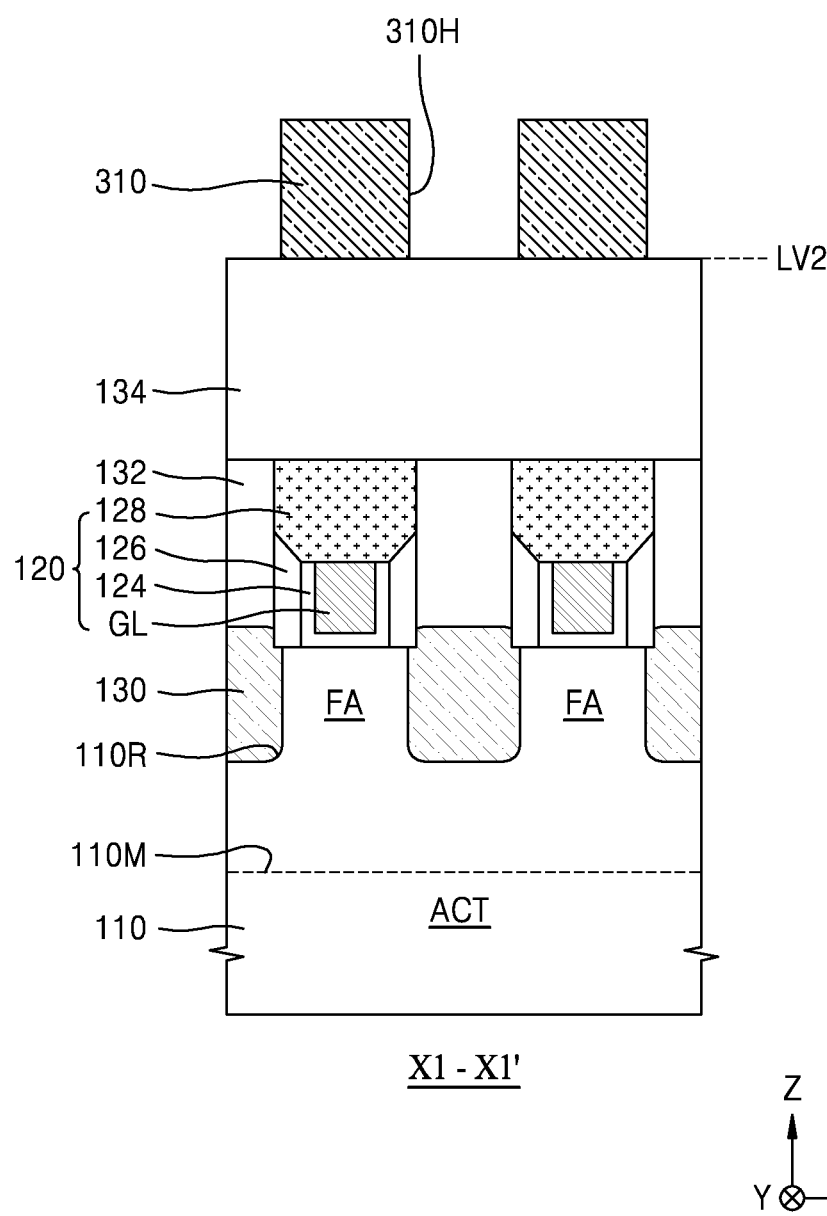

Referring to FIG. 10B, the first interlayer dielectric 134 may be formed on the gate structure 120 and the inter-gate dielectric 132.

Next, a first mask pattern 310 including a plurality of first openings 310H may be formed on the first interlayer dielectric 134. For example, the plurality of first openings 310H may be arranged such that each of the plurality of first openings 310H vertically overlaps the source/drain region 130.

Figure 10C:
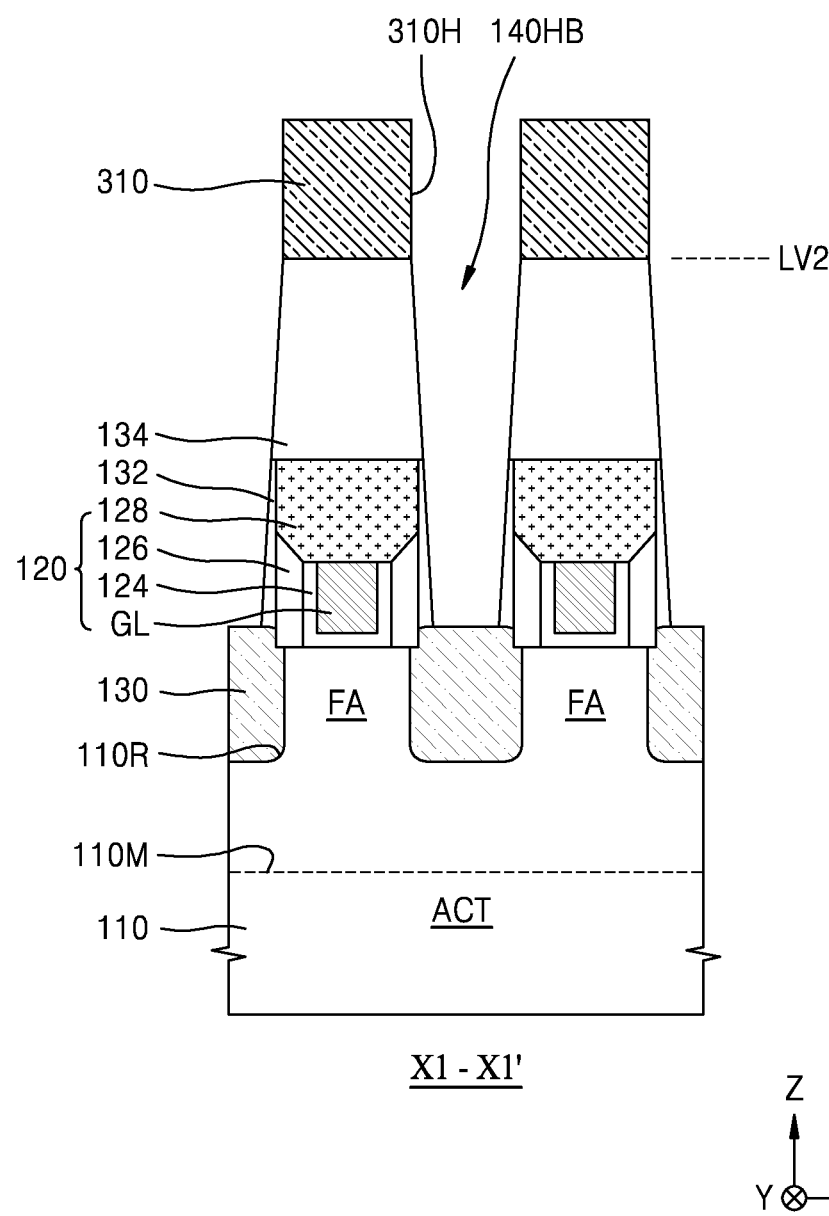

Referring to FIG. 10C, the first interlayer dielectric 134 and the inter-gate dielectric 132 may be removed by using the first mask pattern 310 as an etch mask, thereby forming the first contact hole 140HB. A top surface of the source/drain region 130 may be exposed at the bottom of the first contact hole 140HB.

Figure 10D:
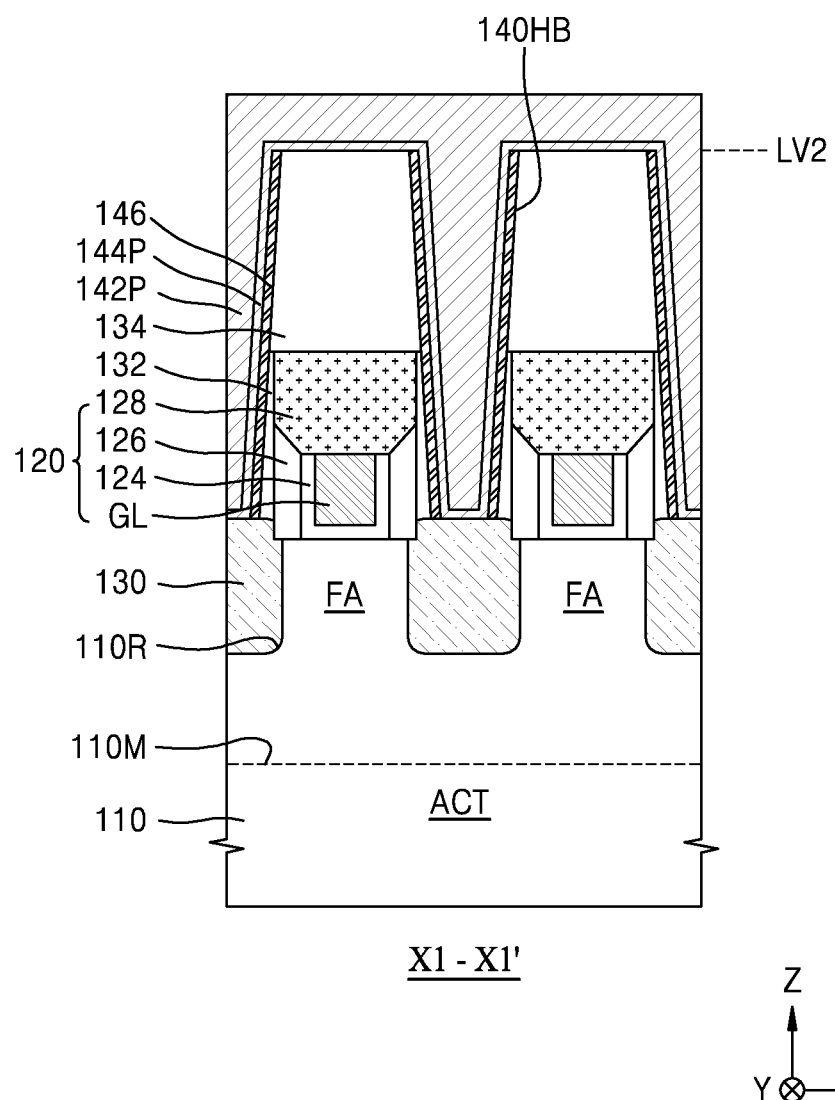

Referring to FIG. 10D, the top surface of the first interlayer dielectric 134 may be exposed again by removing the first mask pattern 310 (see FIG. 10C).

Next, an insulating layer (not shown) may be formed on the first interlayer dielectric 134 and an inner wall of the first contact hole 140HB. The insulating layer may undergo an anisotropic etching process, whereby the first insulating liner 146 may remain on a sidewall of the first contact hole 140HB. The top surface of the source/drain region 130 may be exposed again by the anisotropic etching process.

Next, a barrier layer 144P and a filling conductive layer 142P may be sequentially formed on the first interlayer dielectric 134 and the inner wall of the first contact hole 140HB.

Figure 10E:
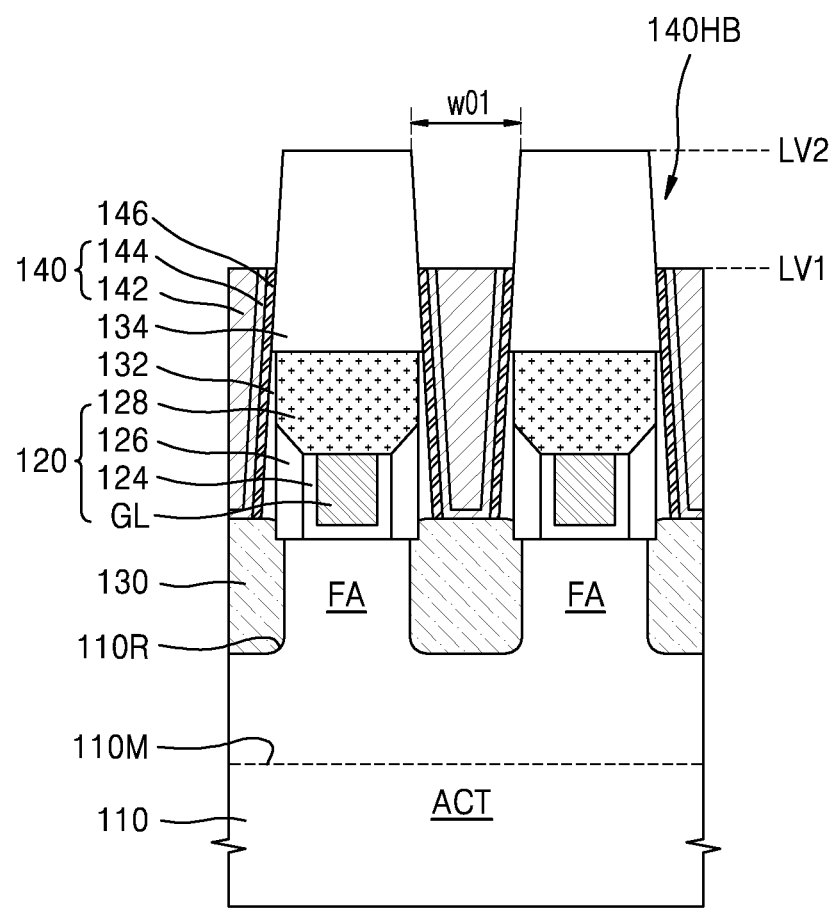
Figure 10E:
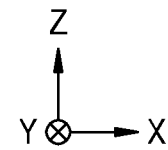

Referring to FIG. 10E, upper portions of both the barrier layer 144P and the filling conductive layer 142P may be removed by an etch-back or CMP process, whereby the first barrier layer 144 and the first contact plug 142 may remain in the first contact hole 140HB. In example embodiments, a top surface of the first contact plug 142 may be at the level LV1 lower than the level LV2 of the top surface of the first interlayer dielectric 134. An upper portion of the first insulating liner 146 may also be removed by the etch-back or CMP process, whereby the top surface of the first insulating liner 146 may be coplanar with the top surface of the first contact plug 142.

Figure 10F:
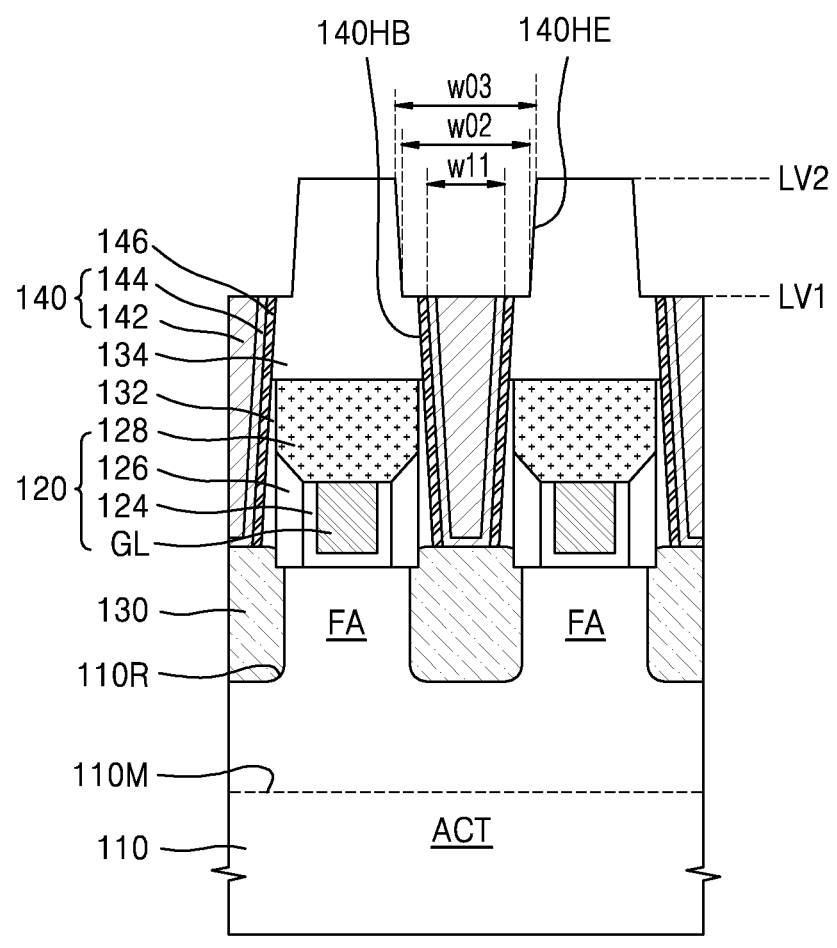

Referring to FIG. 10F, a portion of the first interlayer dielectric 134, which is exposed at the upper sidewall of the first contact hole 140HB, may be removed by as much as a certain width by a lateral enlargement process, thereby forming the enlarged upper region 140HE. The enlarged upper region 140HE may refer to an inner region of the first contact hole 140HB, which is at a higher level than the top surface of the first contact structure 140.

A top width w03 (that is, a width at the level LV2) of the enlarged upper region 140HE may be greater than a top width w01 (see FIG. 10E) of the first contact hole 140HB before the lateral enlargement process. In addition, the top width w03 of the enlarged upper region 140HE may be greater than a bottom width w02 (that is, a width at the level LV1) thereof. Further, by the lateral enlargement process, the bottom width w02 of the enlarged upper region 140HE may be greater than the first width w11 of the top surface of the first contact structure 140.

In example embodiments, the lateral enlargement process may include a wet etching process using a fluorine-based etchant or a dry etching process using a fluorine-based gas. However, the inventive concept is not limited thereto.

Figure 10G:
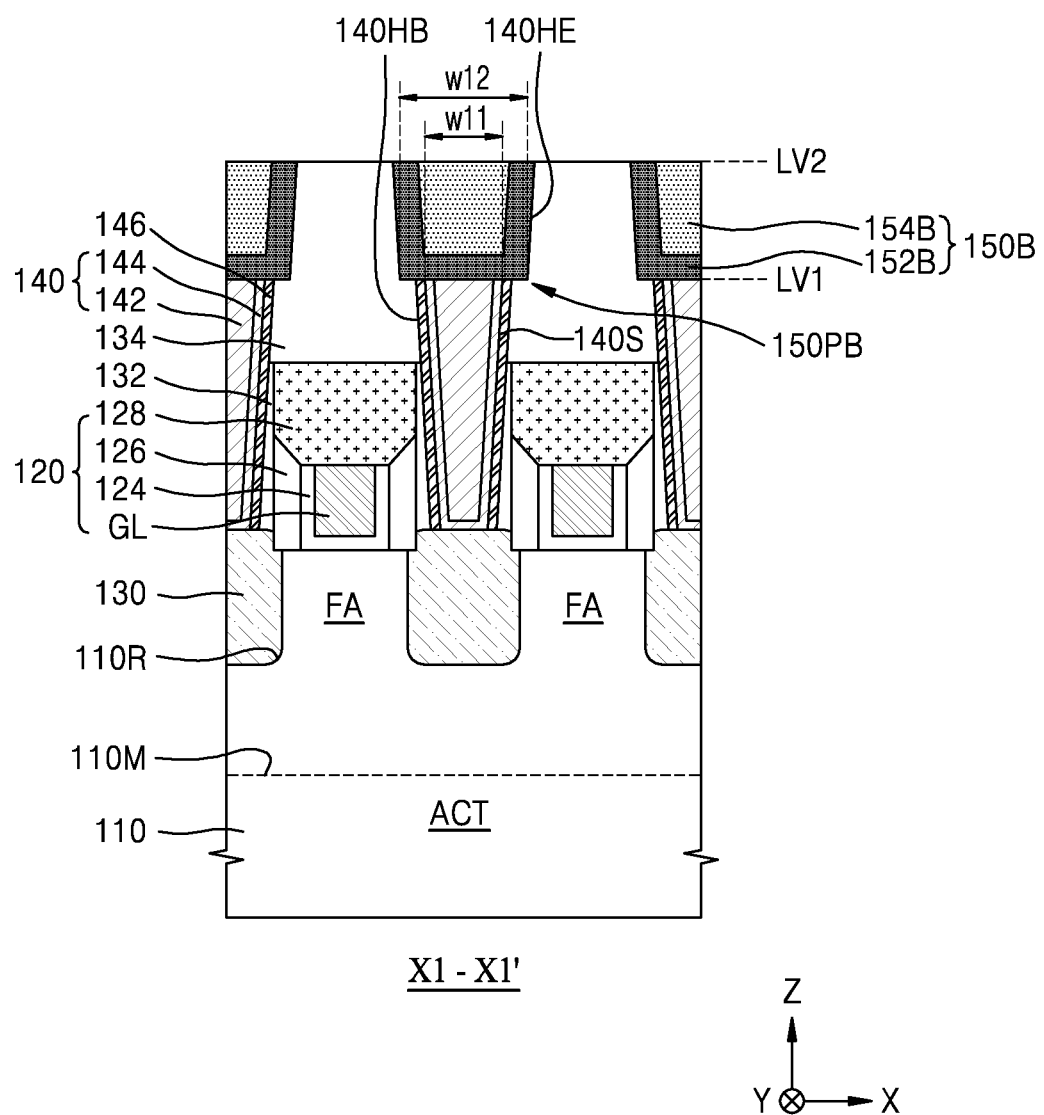

Referring to FIG. 10G, the first capping layer 152B and the second capping layer 154B may be sequentially formed in the enlarged upper region 140HE. The first capping layer 152B may be conformally formed on an inner wall of the enlarged upper region 140HE, and the second capping layer 154B may fill the remaining portion of the enlarged upper region 140HE.

The first capping layer 152B may include a material having better etch resistance than the second capping layer 154B. In example embodiments, the first capping layer 152B may be formed by using silicon carbide including about 15 at % of carbon. For example, although the first capping layer 152B may be formed to a thickness corresponding to about 10% to about 30% of the bottom width w02 (see FIG. 10F) of the enlarged upper region 140HE, the inventive concept is not limited thereto.

As the first capping layer 152B is conformally formed on the inner wall of the enlarged upper region 140HE, the protruding portion 150PB may be formed at the bottom of the first capping layer 152B. The protruding portion 150PB may refer to a portion of the first capping layer 152B, which protrudes outwards from the sidewall 140S of the first contact structure 140.

Figure 10H:
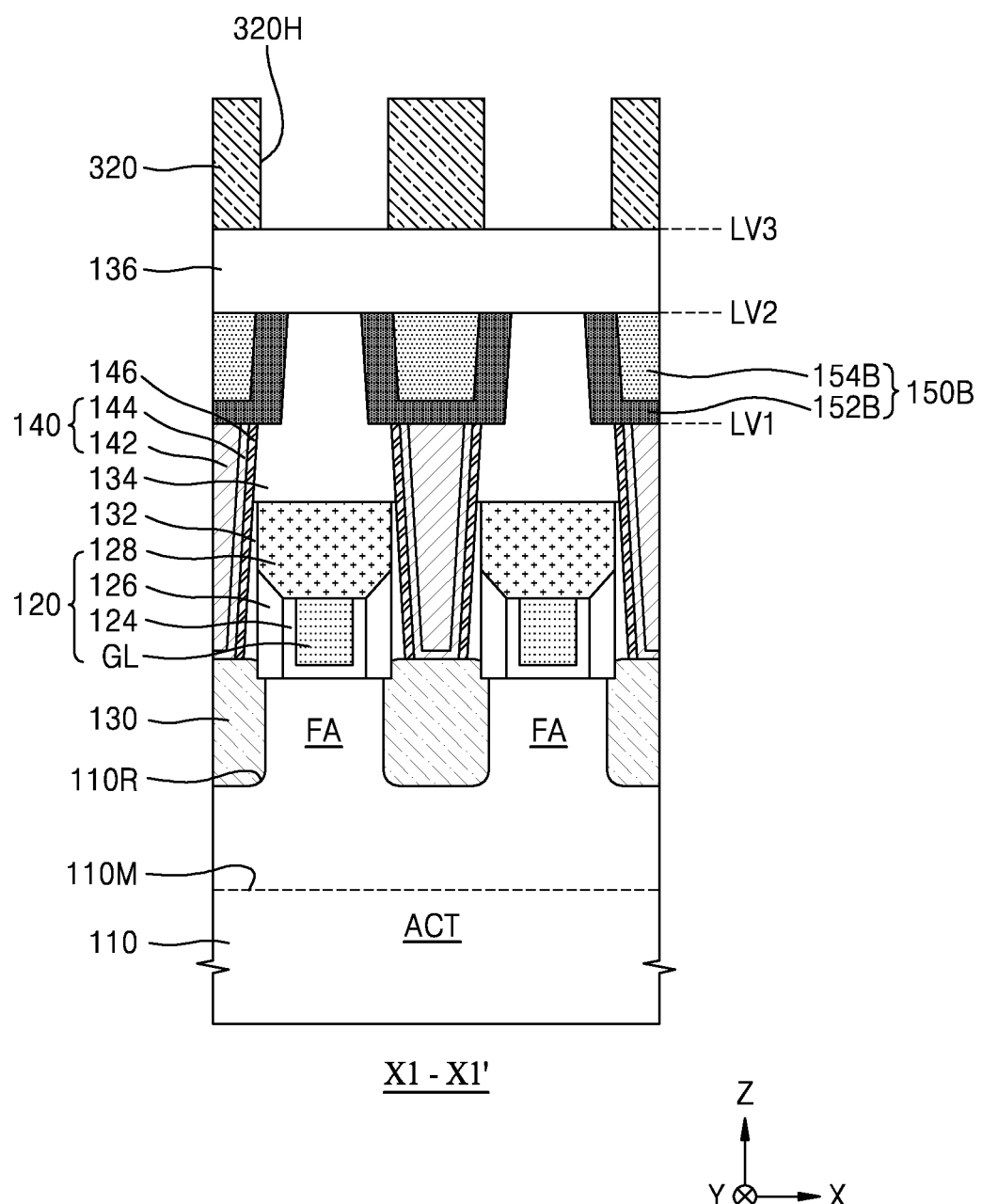

Referring to FIG. 10H, the second interlayer dielectric 136 may be formed on the first interlayer dielectric 134, the first capping layer 152B, and the second capping layer 154B. Next, a second mask pattern 320 including a plurality of second openings 320H may be formed on the second interlayer dielectric 136. The plurality of second openings 320H may be arranged such that each of the plurality of second openings 320H vertically overlaps the gate structure 120. In addition, each of the plurality of second openings 320H may vertically overlap a portion of the first capping layer 152B.

Figure 10I:
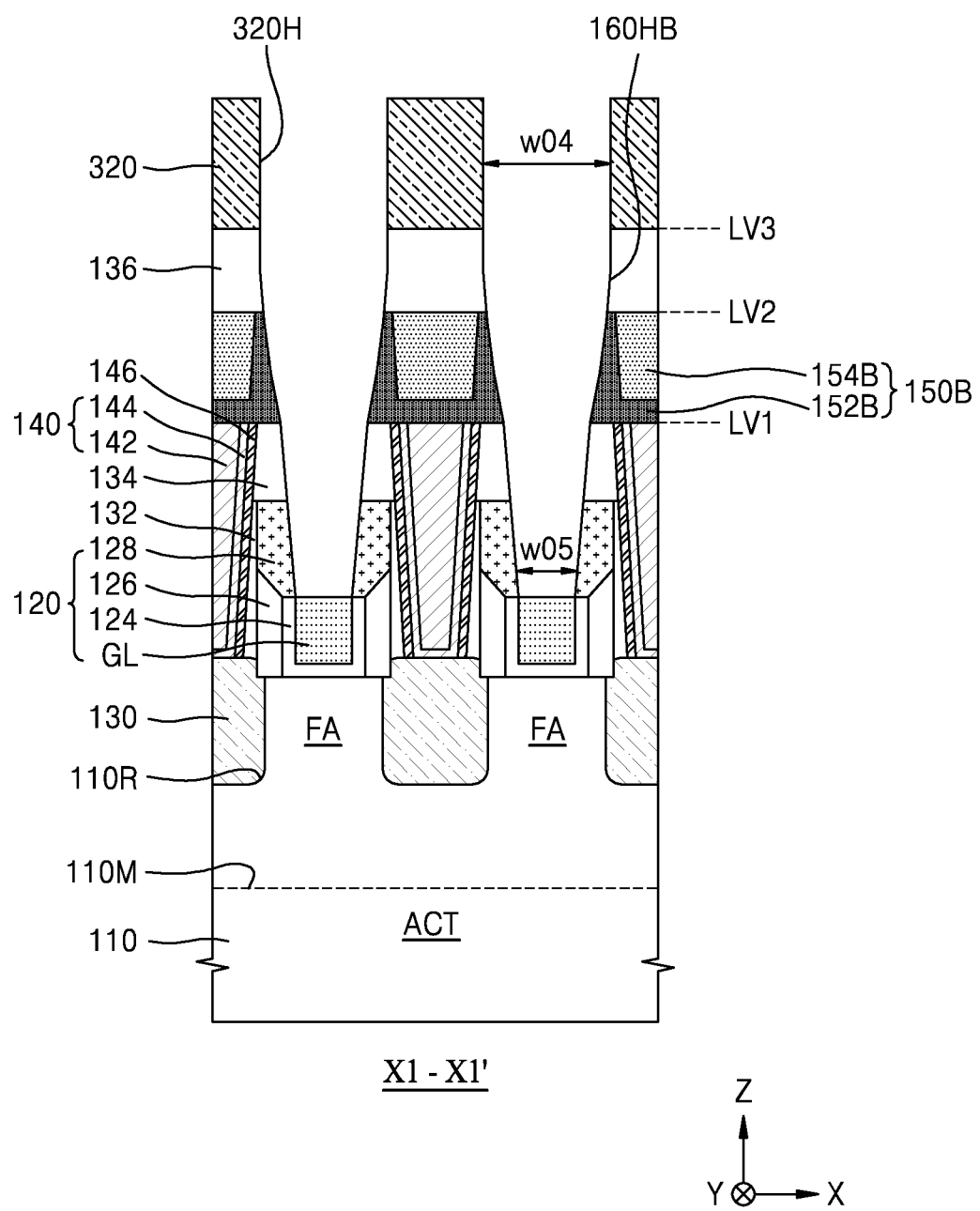

Referring to FIG. 10I, the second interlayer dielectric 136, the first interlayer dielectric 134, and the gate capping layer 128 may be removed by using the second mask pattern 320 as an etch mask, thereby forming the second contact hole 160HB. The top surface of the gate line GL may be exposed at the bottom of the second contact hole 160HB.

In a process of forming the second contact hole 160HB, the top surface of the first capping layer 152B may be partially exposed. The first capping layer 152B may include a material having relatively high etch resistance with respect to an etching atmosphere of the first interlayer dielectric 134, and thus, an edge of the first capping layer 152B, which is exposed at an inner wall of the second contact hole 160HB, may be etched relatively less than the first interlayer dielectric 134. The second contact hole 160HB may have an inclined sidewall having a relatively high slope in a portion thereof surrounded by the first capping layer 152B. Thus, in the first horizontal direction (X direction), a width w05 of the bottom of the second contact hole 160HB may be less than a width w04 of each of the plurality of second openings 320H.

Figure 10J:
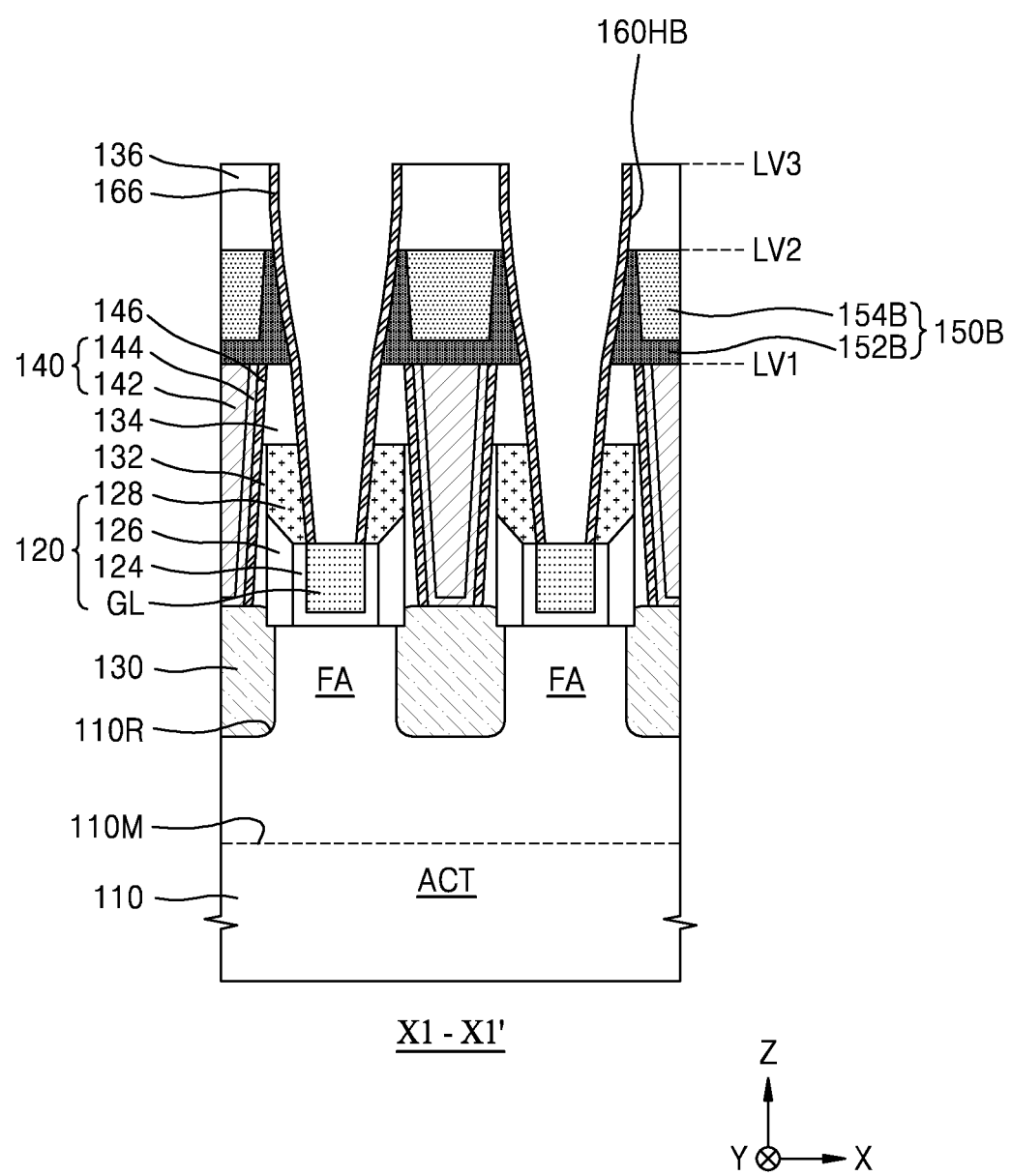

Referring to FIG. 10J, the top surface of the second interlayer dielectric 136 may be exposed again by removing the second mask pattern 320 (see FIG. 10I). An insulating layer (not shown) may be formed on the second interlayer dielectric 136 and the inner wall of the second contact hole 160HB and then undergo an anisotropic etching process, whereby the second insulating liner 166 may remain on the sidewall of the second contact hole 160HB. The top surface of the gate line GL may be exposed again by the anisotropic etching process.

Figure 10K:
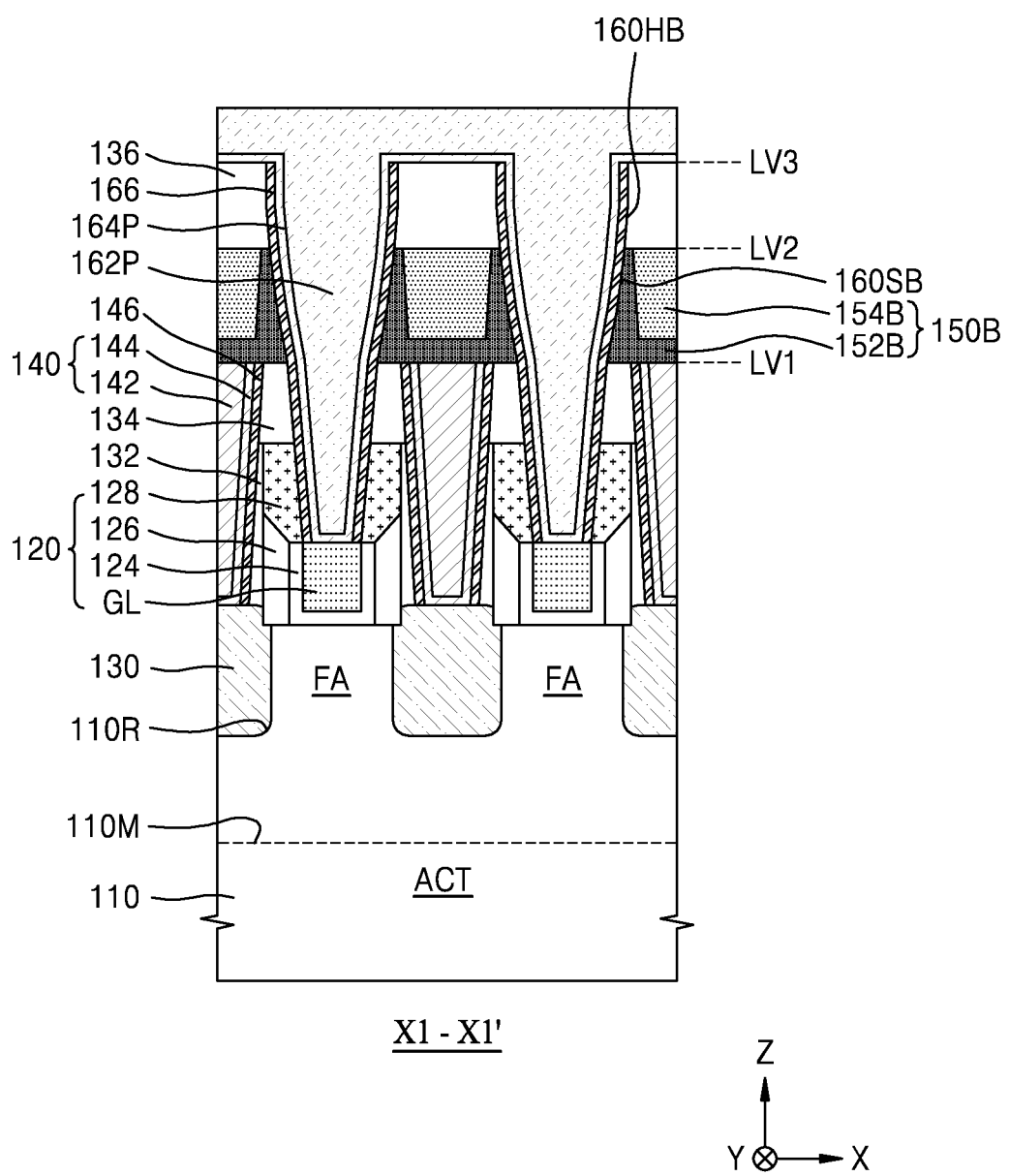

Referring to FIG. 10K, a barrier layer 164P and a filling conductive layer 162P may be sequentially formed on the second interlayer dielectric 136 and the inner wall of the second contact hole 160HB. Since the top width of the second contact hole 160HB is greater than the bottom width thereof, the generation of voids may be reduced or prevented in a process of filling the inside of the second contact hole 160HB with the filling conductive layer 162P.

Figure 10L:
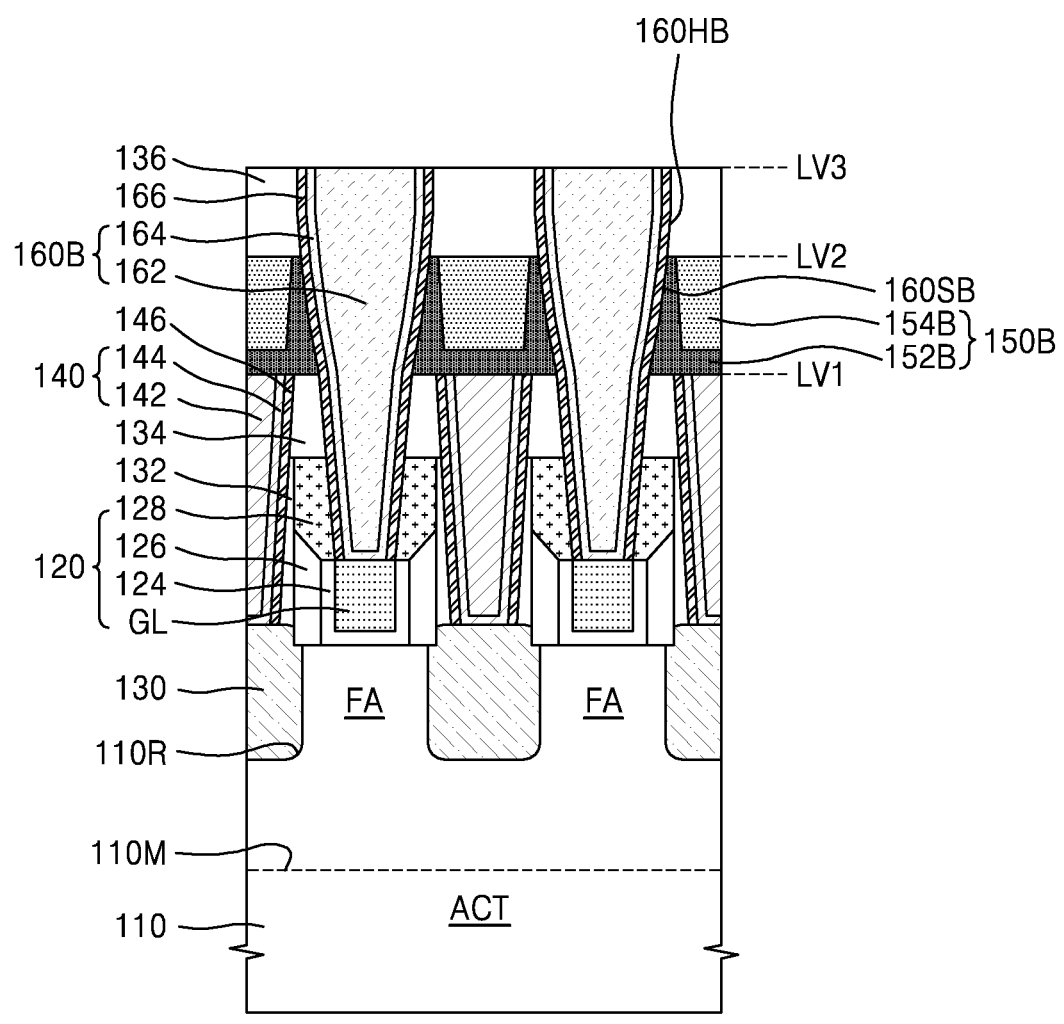

Referring to FIG. 10L, upper portions of both the barrier layer 164P and the filling conductive layer 162P may be removed by an etch-back or CMP process, whereby the second barrier layer 164 and the second contact plug 162 may remain in the second contact hole 160HB.

Figure 10M:
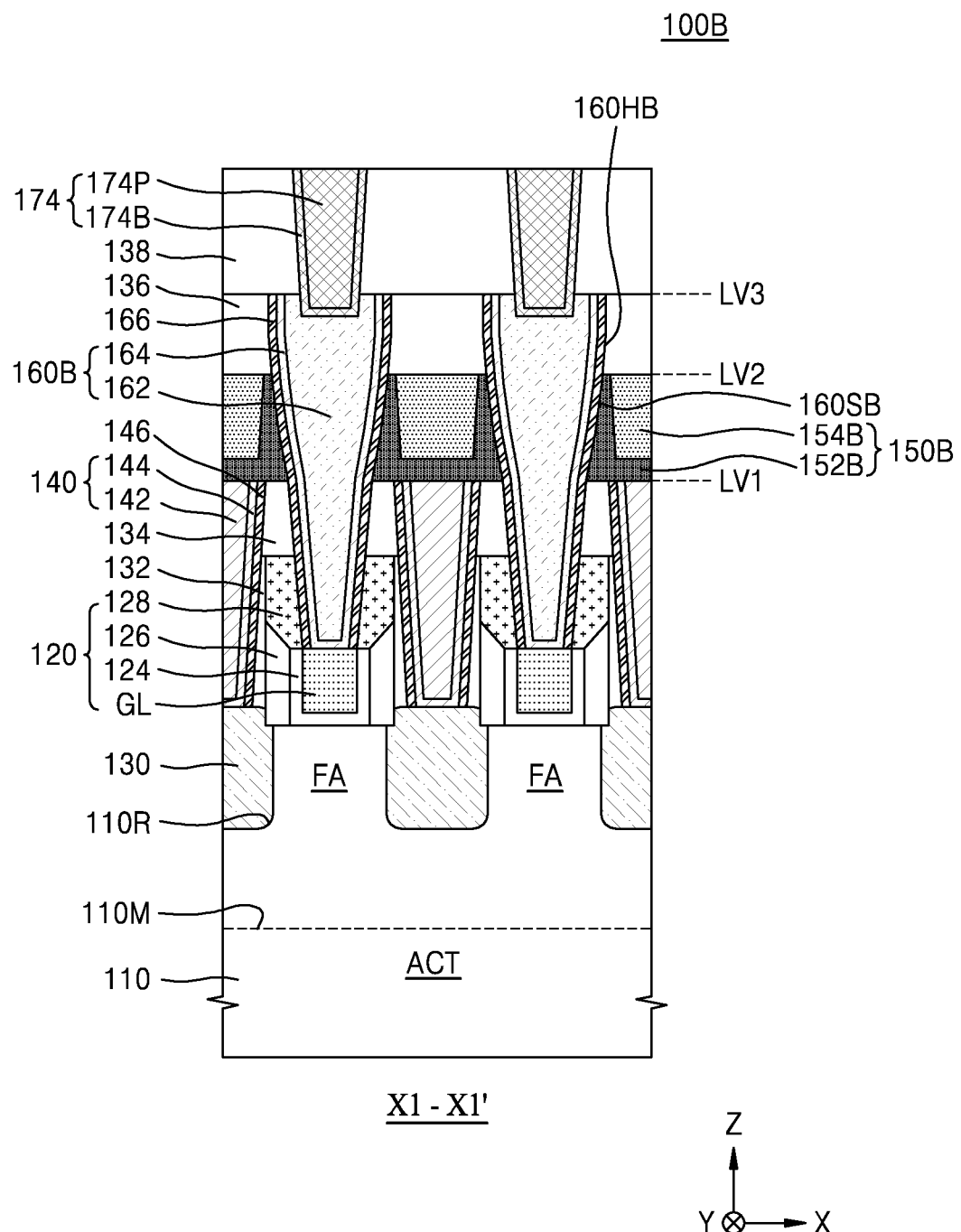

Referring to FIG. 10M, the third interlayer dielectric 138 may be formed on the second interlayer dielectric 136 and the second contact structure 160B.

A first via hole (not shown), which exposes the top surface of the first contact structure 140, may be formed by partially removing the third interlayer dielectric 138, the second interlayer dielectric 136, and the contact capping layer 150B, and a second via hole (not shown), which exposes the top surface of the second contact structure 160B, may be formed by partially removing the third interlayer dielectric 138. Next, the first and second barrier layers 172B (as shown in FIG. 2C) and 174B may be respectively formed on inner walls of both the first via hole and the second via hole, and the first and second via filling layers 172P and 174P may be formed to respectively fill the first via hole and the second via hole.

The integrated circuit device 100B may be completed by performing the processes described above.

Generally, as a degree of integration of an integrated circuit device increases, the width and pitch of the gate line GL decrease, and thus, a distance between the first contact hole 140H and the second contact hole 160HB decreases. For example, when misalignment of the mask pattern 320 occurs in a photolithography process, the first contact structure 140 in the first contact hole 140H may be exposed in an etching process of forming the second contact hole 160H, and thus, an electrical short-circuit may occur between the first contact structure 140 and the second contact structure 160.

However, according to example embodiments, since the second contact hole 160HB may be formed by using, as a self-alignment mask, the contact capping layer 150B covering the top surface of the first contact structure 140, even though the misalignment of the mask pattern 320 occurs, a sufficient separation distance between the first contact structure 140 and the second contact structure 160B may be secured.

In addition, as the top width of the second contact hole 160HB is greater than the bottom width thereof, faults such as void generation and the like may be prevented in a process of forming the second contact structure 160B by filling the inside of the second contact hole 160HB with a metal material and/or a conductive material.

While the inventive concept has been particularly shown and described with reference to embodiments thereof, it will be understood by those skilled in the art that various changes in form and details may be made therein without departing from the spirit and scope of the following claims. In addition, it should be understood that particular terms used herein are only for the purpose of describing the embodiments and are not intended to limit the inventive concept.

Therefore, the scope of the inventive concept should be defined by the accompanying claims and equivalents thereof.

What is claimed is:

1. A method of forming an integrated circuit device comprising:
   forming a gate structure and a source/drain region on a substrate, wherein the source/drain region is on a first side of the gate structure;
   forming an interlayer dielectric on the substrate to overlap the gate structure and the source/drain region;
   forming a first contact hole that penetrates the interlayer dielectric to expose an upper surface of the source/drain region;
   forming a first contact in a lower portion of the first contact hole, wherein the first contact is in contact with the upper surface of the source/drain region;
   laterally expanding the first contact hole by removing a portion of the interlayer dielectric surrounding the first contact hole in a plan view to form an enlarged upper region;
   forming a contact capping layer in the enlarged upper region;
   forming a second contact hole that penetrates the interlayer dielectric to expose an upper surface of the gate structure, wherein a sidewall of the contact capping layer is exposed to an inner wall of the second contact hole; and
   forming a second contact in the second contact hole, wherein the second contact is in contact with the upper surface of the gate structure.

2. The method of claim 1, wherein forming the contact capping layer comprises:
   forming a first capping layer on an inner wall of the enlarged upper region using a first material; and
   forming a second capping layer on the first capping layer using a second material different from the first material to fill the enlarged upper region.

3. The method of claim 2, wherein the first material has higher etch selectivity with respect to the interlayer dielectric than the second material.

4. The method of claim 2, wherein the first material includes silicon carbide having a first carbon content, the second material includes silicon carbide having a second carbon content, and the second carbon content is different from the first carbon content.

5. The method of claim 4, wherein the first carbon content is greater than the second carbon content.

6. The method of claim 2, wherein when forming the second contact hole, a sidewall of the first capping layer is exposed to the inner wall of the second contact hole.

7. The method of claim 2, wherein when forming the second contact hole, the second capping layer is surrounded by the first capping layer in the plan view and is not exposed to the inner wall of the second contact hole.

8. The method of claim 2, wherein when forming the contact capping layer, the first capping layer protrudes outwards with respect to a sidewall of the first contact.

9. A method of forming an integrated circuit device comprising:
   forming a gate structure and a source/drain region on a substrate, wherein the source/drain region is on a first side of the gate structure;
   forming an interlayer dielectric on the substrate to overlap the gate structure and the source/drain region;
   forming a first contact hole that penetrates the interlayer dielectric to expose an upper surface of the source/drain region;
   forming a first contact in a lower portion of the first contact hole, wherein the first contact is in contact with the upper surface of the source/drain region;
   forming a first capping layer on an inner wall of an upper portion of the first contact hole;
   forming a second capping layer on the first capping layer to at least partially fill an inside of the upper portion of the first contact hole;
   forming a second contact hole that penetrates the interlayer dielectric to expose an upper surface of the gate structure, wherein a sidewall of the first capping layer is exposed to an inner wall of the second contact hole; and
   forming a second contact in the second contact hole, wherein the second contact is in contact with the upper surface of the gate structure,
   wherein the first capping layer includes a material having higher etch selectivity with respect to the interlayer dielectric than a material included in the second capping layer.

10. The method of claim 9, wherein the first capping layer includes silicon carbide having a first carbon content, the second capping layer includes silicon carbide having a second carbon content, and the second carbon content is different from the first carbon content.

11. The method of claim 10, wherein the first carbon content is greater than the second carbon content.

12. The method of claim 9, further comprising:
   prior to forming the first capping layer, laterally expanding the first contact hole by removing a portion of the interlayer dielectric surrounding the first contact hole in plan view to form an enlarged upper region;
   wherein in the forming the first capping layer, the first capping layer is formed in the enlarged upper region.

13. The method of claim 12, wherein a sidewall of the first capping layer protrudes outward with respect to a sidewall of the first contact.

14. The method of claim 12, wherein a bottom surface of the first capping layer has a first width, an upper surface of the first contact has a second width, the first width is greater than the second width.

15. The method of claim 9, wherein in the forming the second contact hole, the second capping layer is surrounded by the first capping layer in plan view and is not exposed to the inner wall of the second contact hole.

16. A method of forming an integrated circuit device comprising:
   forming a gate structure and a source/drain region on a substrate, wherein the source/drain region is on a first side of the gate structure;
   forming an interlayer dielectric on the substrate to overlap the gate structure and the source/drain region;
   forming a first contact hole that penetrates the interlayer dielectric to expose an upper surface of the source/drain region;
   forming a first contact in the first contact hole, wherein the first contact is in contact with the upper surface of the source/drain region;
   forming a contact capping layer on the first contact, the contact capping layer protruding outward with respect to a sidewall of the first contact;
   forming a second contact hole penetrating the interlayer dielectric to expose an upper surface of the gate structure, wherein a sidewall of the contact capping layer is exposed to an inner wall of the second contact hole; and forming a second contact in the second contact hole, wherein the second contact is in contact with the upper surface of the gate structure.

17. The method of claim 16, wherein forming the contact capping layer includes:

forming a first capping layer on the first contact using a first material; and forming a second capping layer on the first capping layer using a second material different from the first material.

18. The method of claim 17, wherein the first material includes silicon carbide having a first carbon content, the second material includes silicon carbide having a second carbon content, and the second carbon content is different from the first carbon content.

19. The method of claim 18, wherein the first carbon content is greater than the second carbon content.

20. The method of claim 17, further comprising:

prior to forming the contact capping layer, laterally expanding the first contact hole by removing a portion of the interlayer dielectric surrounding the first contact hole in plan view to form an enlarged upper region, wherein when forming the first capping layer, the first capping layer is formed in an inner wall of the enlarged upper region, and wherein when forming the second contact hole, a sidewall of the first capping layer is exposed to the inner wall of the second contact hole.

* * * * *